(12) United States Patent
Hamaoka et al.

(10) Patent No.: US 7,786,613 B2
(45) Date of Patent: Aug. 31, 2010

(54) VEHICLE-MOUNTED ELECTRONIC APPARATUS

(75) Inventors: Hirohumi Hamaoka, Kobe (JP); Yusuke Ito, Kobe (JP)

(73) Assignee: Fujitsu Ten Limited, Kobe-shi, Hyogo (JP)

( * ) Notice: Subject to any disclaimer, the term of this patent is extended or adjusted under 35 U.S.C. 154(b) by 1020 days.

(21) Appl. No.: 11/521,550

(22) Filed: Sep. 15, 2006

(65) Prior Publication Data

US 2007/0068366 A1 Mar. 29, 2007

(30) Foreign Application Priority Data

Sep. 28, 2005 (JP) .............................. 2005-283080

(51) Int. Cl.
*B60L 1/00* (2006.01)
(52) U.S. Cl. ...................................................... 307/9.1
(58) Field of Classification Search .................. 307/9.1, 307/10.1
See application file for complete search history.

(56) References Cited

U.S. PATENT DOCUMENTS

| | | | |
|---|---|---|---|
| 4,211,976 A * | 7/1980 | Inoue | 455/344 |
| 5,278,808 A * | 1/1994 | Takano | 369/11 |
| 5,850,215 A | 12/1998 | Kamiya et al. | |
| 5,852,594 A * | 12/1998 | Kaise et al. | 720/647 |
| 5,917,435 A | 6/1999 | Kamiya et al. | |
| 6,147,596 A * | 11/2000 | Tsuchiya et al. | 340/425.5 |
| 6,147,938 A * | 11/2000 | Ogawa et al. | 369/12 |
| 6,935,597 B2 * | 8/2005 | Shibuya | 248/27.1 |
| 2002/0024597 A1 | 2/2002 | Arai et al. | |
| 2002/0135231 A1 | 9/2002 | Miura | |
| 2004/0008196 A1 | 1/2004 | Tadokora et al. | |
| 2004/0053520 A1 | 3/2004 | Reinhardt et al. | |
| 2005/0018392 A1 | 1/2005 | Strohmeier et al. | |

FOREIGN PATENT DOCUMENTS

| | | |
|---|---|---|
| DE | 10037596 | 4/2001 |
| DE | 19957252 | 5/2001 |
| DE | 10015046 | 10/2001 |
| DE | 10054589 | 5/2002 |
| EP | 0868116 | 9/1998 |

(Continued)

OTHER PUBLICATIONS

Korean Notice Requesting Submission of Opinion (along with English translation) dated Jul. 23, 2007 for counterpart Korean Patent Application No. 10-2006-0090557 is provided for the purpose of certification under 37 C.F.R. 1.97(e).

(Continued)

*Primary Examiner*—Albert W Paladini
(74) *Attorney, Agent, or Firm*—Harness, Dickey & Pierce, P.L.C.

(57) ABSTRACT

There is provided an electronic apparatus having a simple anti-theft mechanism. In this construction, a detachable panel unit is designed to render the electronic apparatus operative in a state of being attached to the electronic apparatus main body, and to render the electronic apparatus inoperative in a state of being detached from the electronic apparatus main body. By virtue of this configuration, the electronic apparatus main body, namely the electronic apparatus in itself can be prevented from being stolen from a vehicle simply by detaching the detachable panel unit and placing it in a secret area determined by users or others.

21 Claims, 21 Drawing Sheets

FOREIGN PATENT DOCUMENTS

| | | |
|---|---|---|
| JP | 8-124368 | 5/1996 |
| JP | 8-258632 | 10/1996 |
| JP | 8-318792 | 12/1996 |
| JP | 10276249 | 10/1998 |
| JP | 2001-202764 | 7/2001 |
| JP | 2001-344954 | 12/2001 |
| JP | 2002-74922 | 3/2002 |
| JP | 2002-93141 | 3/2002 |
| JP | 2002-109868 | 4/2002 |
| JP | 2002-318129 | 10/2002 |
| JP | A 2003-007041 | 1/2003 |
| JP | 2003-323789 | 11/2003 |
| JP | A 2004-034753 | 2/2004 |
| JP | A 2004-132771 | 4/2004 |
| JP | 2005-1456 | 1/2005 |
| JP | 2005-135552 | 5/2005 |
| JP | 2006-66000 | 3/2006 |
| JP | 2006-66035 | 3/2006 |
| KR | 10-0595536 B | 6/2006 |
| KR | 10-2006-0083357 | 7/2006 |

OTHER PUBLICATIONS

European Search Report dated Feb. 24, 2010, in corresponding European Application No. 06019617.7.

* cited by examiner

VEHICLE-MOUNTED ELECTRONIC APPARATUS

BACKGROUND OF THE INVENTION

1. Field of the Invention

The present invention relates to a vehicle-mounted electronic apparatus, and more particularly to a technique that is suitable for use in a vehicle-mounted apparatus such as an audio visual navigation system.

2. Description of the Related Art

Vehicle-mounted apparatuses such as navigation systems have been developed for commercial use (refer to Japanese Unexamined Patent Publication JP-A2002-318129, for instance). Such vehicle-mounted apparatuses are generally designed in conformity with the DIN (Deutsche Industre Normen) standards. In terms of general versatility, limitations of mounting space, or other factors, there may be cases where a vehicle-mounted apparatus of 1 DIN size (a model of the type that is designed to fit in a 1-DIN space) is preferable to a vehicle-mounted apparatus of 2 DIN size (a model of the type that is designed to fit in a 2-DIN space).

There is some risk of a vehicle-mounted apparatus of conventional design being stolen from a vehicle even if the doors of the vehicle are locked. In order to avoid this, users have to take some anti-theft measure when getting away from the vehicle, for example: (1) hide the vehicle-mounted apparatus as a whole from sight with a cover; (2) detach the vehicle-mounted apparatus from the vehicle.

However, in order to effect the measure (1), the vehicle-mounted apparatus needs to be constructed with a low degree of design flexibility at a higher manufacturing cost. Moreover, in order to effect the measure (2), users are required to make troublesome efforts such as removal of a plurality of bolts and detachment of a plurality of connectors from the vehicle.

SUMMARY OF THE INVENTION

Accordingly, it is an object of the invention to provide a vehicle-mounted electronic apparatus having a simple anti-theft mechanism.

The invention provides a vehicle-mounted electronic apparatus comprising:
a storage medium;
a first board in which an avoiding portion for avoiding interference with the storage medium is formed;
a second board arranged on the storage medium; and
a main body unit for housing the storage medium, the first board and the second board, the main body unit having an opening portion through which the storage medium can be attached to and detached from the main body unit.

According to the invention, the storage medium, the first board, and the second board are housed in the main body unit so as to be as close to each other as possible, so that the apparatus can be made thin.

In the invention, it is preferable that the first board is provided with at least a navigation section for performing a navigating operation, and
the second board is provided with at least an audio section for reproducing music data and a recording section for recording on the storage medium the music data reproduced by the audio section.

According to the invention, the first board is provided with the navigation section, and the second board is provided with the audio section and the recording section in combination with each other, so that the apparatus can be made thin.

In the invention, it is preferable that the vehicle-mounted electronic apparatus further comprises:
a first fan for cooling the first board; and
a second fan for cooling the second board.

According to the invention, the vehicle-mounted electronic apparatus is provided with the first fan for cooling the first board and the second fan for cooling the second board, so that heat-generating constituent components undergo cooling in an efficient manner.

In the invention, it is preferable that the vehicle-mounted electronic apparatus further comprises a display section housed in a casing separately formed from the main body unit,
wherein the main body unit and the casing for housing the display section are attached to each other.

According to the invention, the main body unit and the display section are constructed in a form of a two-divided casing, so that the main body unit and the display section can be fabricated separately but simultaneously and assembled together, which results in takt time saving.

In the invention, it is preferable that the vehicle-mounted electronic apparatus further comprises:
a display section which can be inserted into or ejected from the main body unit; and
an operation button for operating the vehicle-mounted electronic apparatus,
wherein the operation buttons are divided between the main body unit and the display section according to function.

According to the invention, the operation buttons of the main body unit and the operation buttons of the display section are divided according to function, so that a required operation can be effected quickly.

In the invention, it is preferable that on the display section are arranged operation buttons for operations necessary while the display section is in a state of being ejected from the main body unit.

According to the invention, on the display section are arranged the operation buttons for operations necessary while the display section is in a state of being ejected from the main body unit, so that a required operation can be effected quickly.

In the invention, it is preferable that the vehicle-mounted electronic apparatus further comprises:
a display section which can be inserted into or ejected from the main body unit;
a reproducing section for reproducing information recorded on a recording medium inserted into the main body unit; and
a recording section for recording on the storage medium the information reproduced by the reproducing section,
wherein the recording section can carry out recording of the information regardless of whether the display section is in an inserted state or in an ejected state.

According to the invention, the recording of the information can be carried out regardless of whether the display section is in an inserted state or in an ejected state and it is therefore not necessary to bring the display section to a state of being ejected from the main body unit during recording of the information so that ease-of-use of the apparatus can be enhanced.

In the invention, it is preferable that the main body unit conforms to a 1 DIN standard of a vehicle.

According to the invention, the main body unit conforms to the 1 DIN standard of vehicles, so that the apparatus can be made thin.

Further, the invention provides a vehicle-mounted electronic apparatus comprising:

an electronic apparatus main body through which a first recording medium and a second recording medium can be inserted and ejected; and an operation section which can be attached to and detached from the electronic apparatus main body, wherein the first recording medium can be inserted and ejected through the electronic apparatus main body having the operation section attached thereto, and the second recording medium can be inserted and ejected through the electronic apparatus main body having the operation section detached therefrom.

According to the invention, the first recording medium can be inserted and ejected through the electronic apparatus main body having the operation section attached thereto while the second recording medium can be inserted and ejected through the electronic apparatus main body having the operation section detached therefrom, so that without need of providing the operation section with a new insertion/ejection port for the second recording medium, it is possible to give the electronic apparatus main body a function for reproducing the information recorded on the second recording medium.

Further, the invention provides a vehicle-mounted electronic apparatus comprising:

an electronic apparatus main body having separate insertion/ejection ports, one of which allows insertion and ejection of the first recording medium, and another of which allows insertion and ejection of the second recording medium; and an operation section which can be attached to and detached from the electronic apparatus main body, wherein the insertion/ejection ports are arranged so that the insertion/ejection port for the first recording medium is exposed when the operation section is attached to the electronic apparatus main body, and the insertion/ejection port for the second recording medium is exposed when the operation section is detached from the electronic apparatus main body.

According to the invention, the first recording medium can be inserted and ejected through the electronic apparatus main body having the operation section attached thereto while the second recording medium can be inserted and ejected through the electronic apparatus main body having the operation section detached therefrom, so that without need of providing the operation section with a new insertion/ejection port for the second recording medium, it is possible to give the electronic apparatus main body a function for reproducing the information recorded on the second recording medium.

In the invention, it is preferable that the operation section has the insertion/ejection port for the first recording medium but not the insertion/ejection port for the second recording medium.

According to the invention, the operation section has the insertion/ejection port for the first recording medium, but not the insertion/ejection port for the second recording medium, so that without need of providing the operation section with a new insertion/ejection port for the second recording medium, it is possible to give the electronic apparatus main body a function for reproducing the information recorded on the second recording medium.

In the invention, it is preferable that the operation section is provided with a concavity for preventing interference with the second recording medium inserted into the electronic apparatus main body in a state of being attached to the electronic apparatus main body.

According to the invention, the operation section is provided with a concavity for preventing interference with the second recording medium inserted into the electronic apparatus main body, so that it is possible to prevent interference between the operation section and the second recording medium.

In the invention, it is preferable that the first recording medium is an optical disk, and the second recording medium is a semiconductor memory.

According to the invention, a frequently-used optical disk can be used for the electronic apparatus main body having the operation section attached thereto, and a less frequently-used optical disk can be used for the electronic apparatus main body having the operation section detached therefrom, so that it is possible to increase a variety of usable recording mediums with constant ease-of-use of the apparatus.

In the invention, it is preferable that the electronic apparatus main body conforms to a 1 DIN standard of vehicles.

According to the invention, the electronic apparatus main body conforms to a 1 DIN standard of vehicles, so that the apparatus can be made thin.

The invention provides a vehicle-mounted electronic apparatus comprising:

a casing having an upper part and a lower part, the casing conforming to a 1 DIN standard mountable on a vehicle;

a display section housed in the upper part of the casing;

a driving section housed in the upper part of the casing, the driving section ejecting the display section to outside of the casing;

an audio board housed in the lower part of the casing;

a navigation board housed in the lower part of the casing;

a storage medium housed in the lower part of the casing, the storage medium being capable of communicating the navigation board and the audio board; and a reproducing section housed in the lower part of the casing, the reproducing section being capable of reproducing a compact disk.

According to the invention, of the casing in conformity with the 1 DIN standard mountable in a vehicle, in the upper part are housed the display section and the driving section, and in the lower part are housed the audio board, the navigation board, the storage medium, and the reproducing section, so that it is possible to constitute an audio visual navigation system in conformity with the 1 DIN standard particular for vehicles.

In the invention, it is preferable that the vehicle-mounted electronic apparatus further comprises an operation section having a compact disk insertion/ejection port, which can be attached to and detached from the casing.

According to the invention, it is possible to use a compact disk by the vehicle-mounted electronic apparatus having the operation section attached thereto and moreover, the vehicle-mounted electronic apparatus itself can be prevented from being stolen from a vehicle simply by detaching the operation section and placing it in a secret area determined by users or others.

In the invention, it is preferable that the casing is provided with an insertion/ejection port exposed for a semiconductor memory when the operation section is detached from the electronic apparatus main body.

According to the invention, without need of providing the operation section with a new insertion/ejection port for the second recording medium, it is possible to give the electronic apparatus main body a function for reproducing the information recorded on the semiconductor memory.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
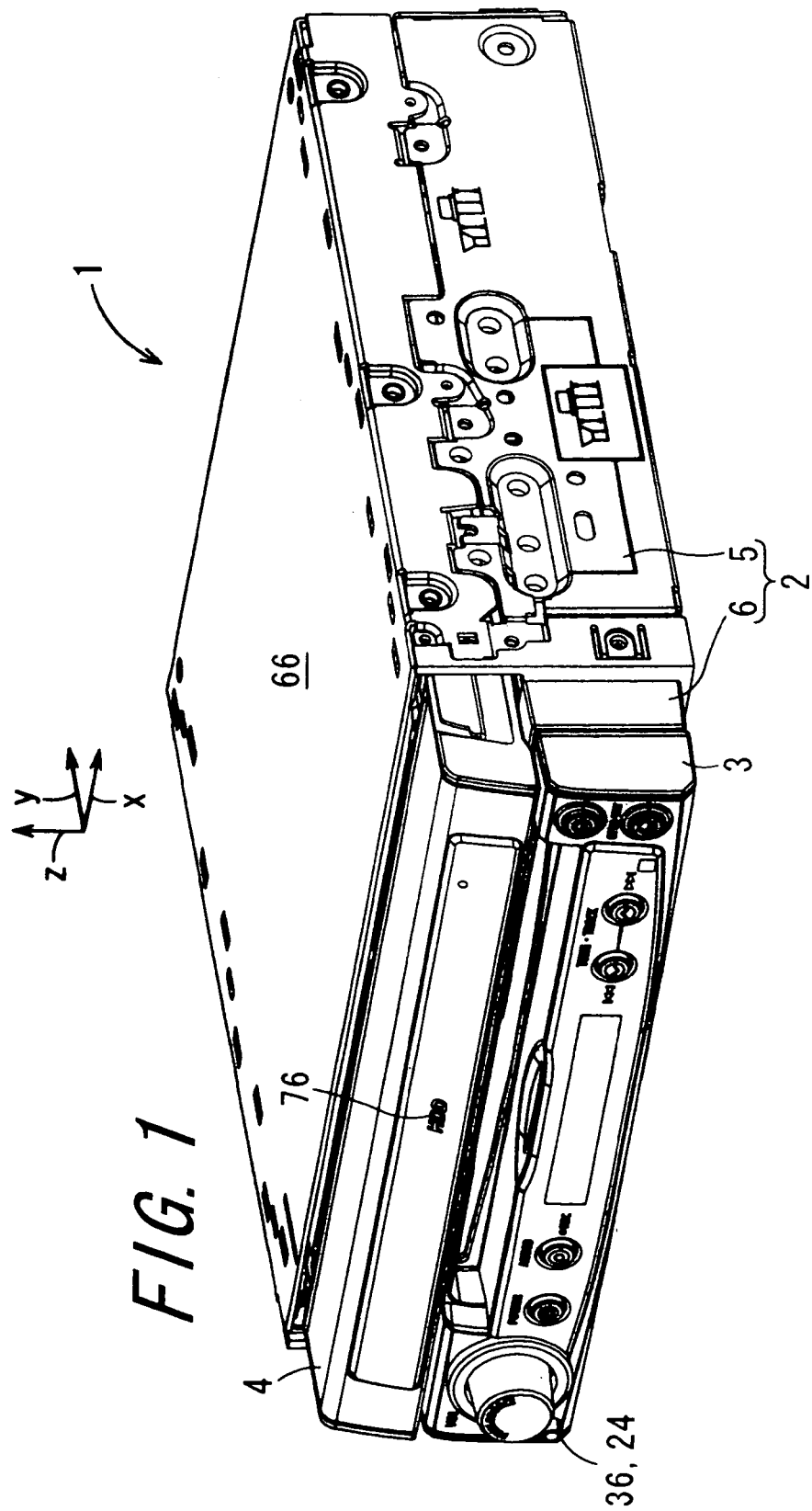
FIG. 1 is a perspective view of a vehicle-mounted electronic apparatus according to one embodiment of the invention.

Now referring to the drawings, preferred embodiments of the invention are described below.

Figure 2:
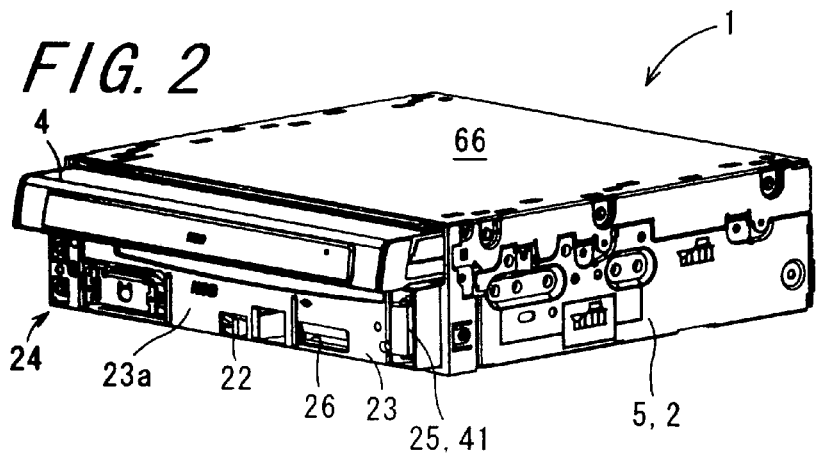
FIG. 2 is a perspective view showing the vehicle-mounted electronic apparatus, with its detachable panel unit removed.
Figure 3:
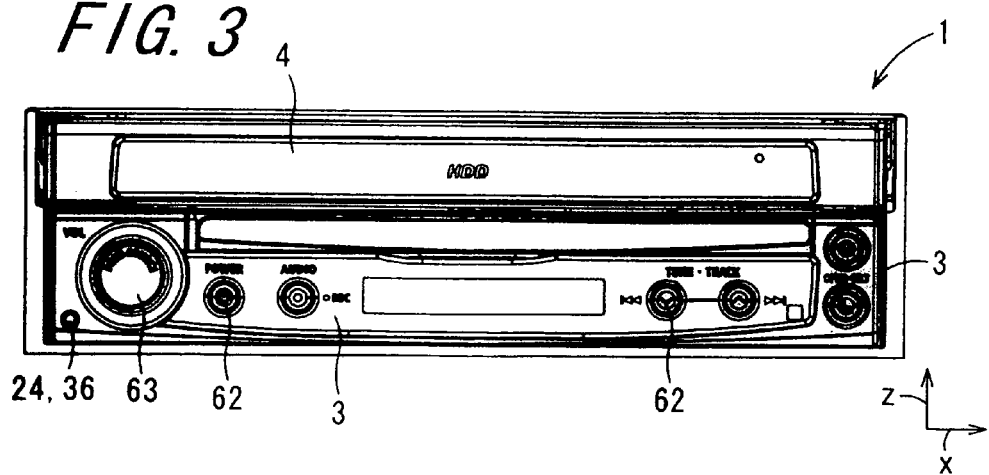
FIG. 3 is a front view of the vehicle-mounted electronic apparatus.
Figure 4:
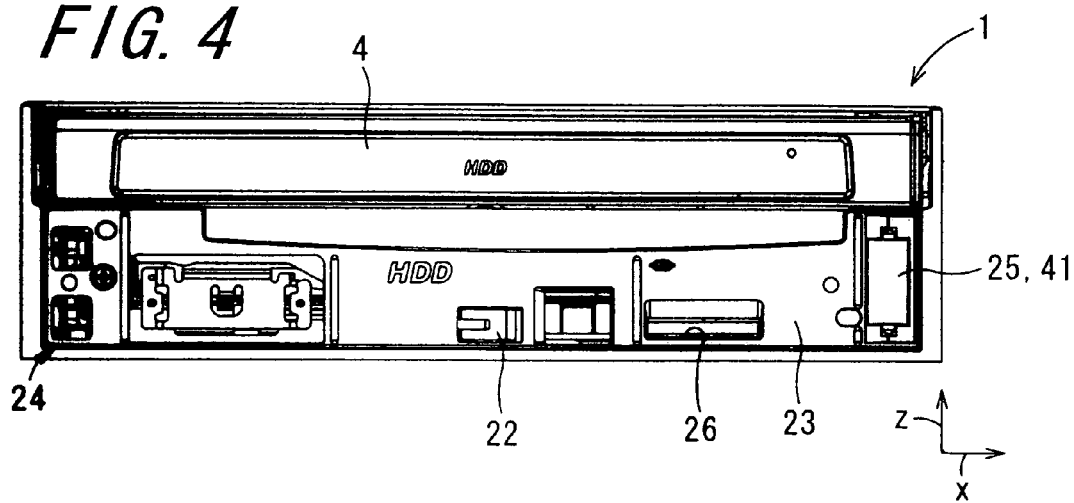
FIG. 4 is a front view showing the vehicle electronic apparatus, with its detachable panel unit removed.
Figure 5:
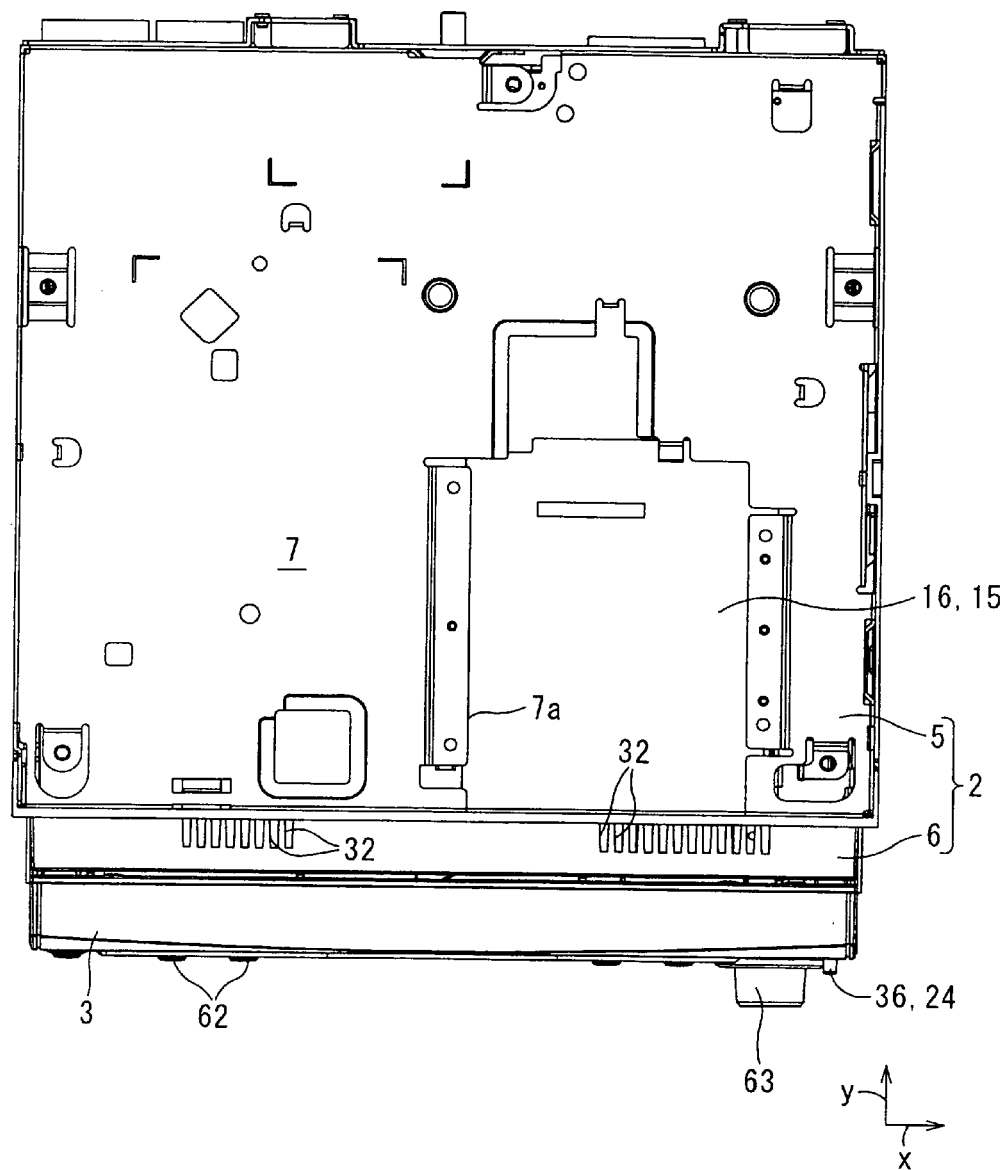
FIG. 5 is a bottom view of the vehicle-mounted electronic apparatus.
Figure 6:
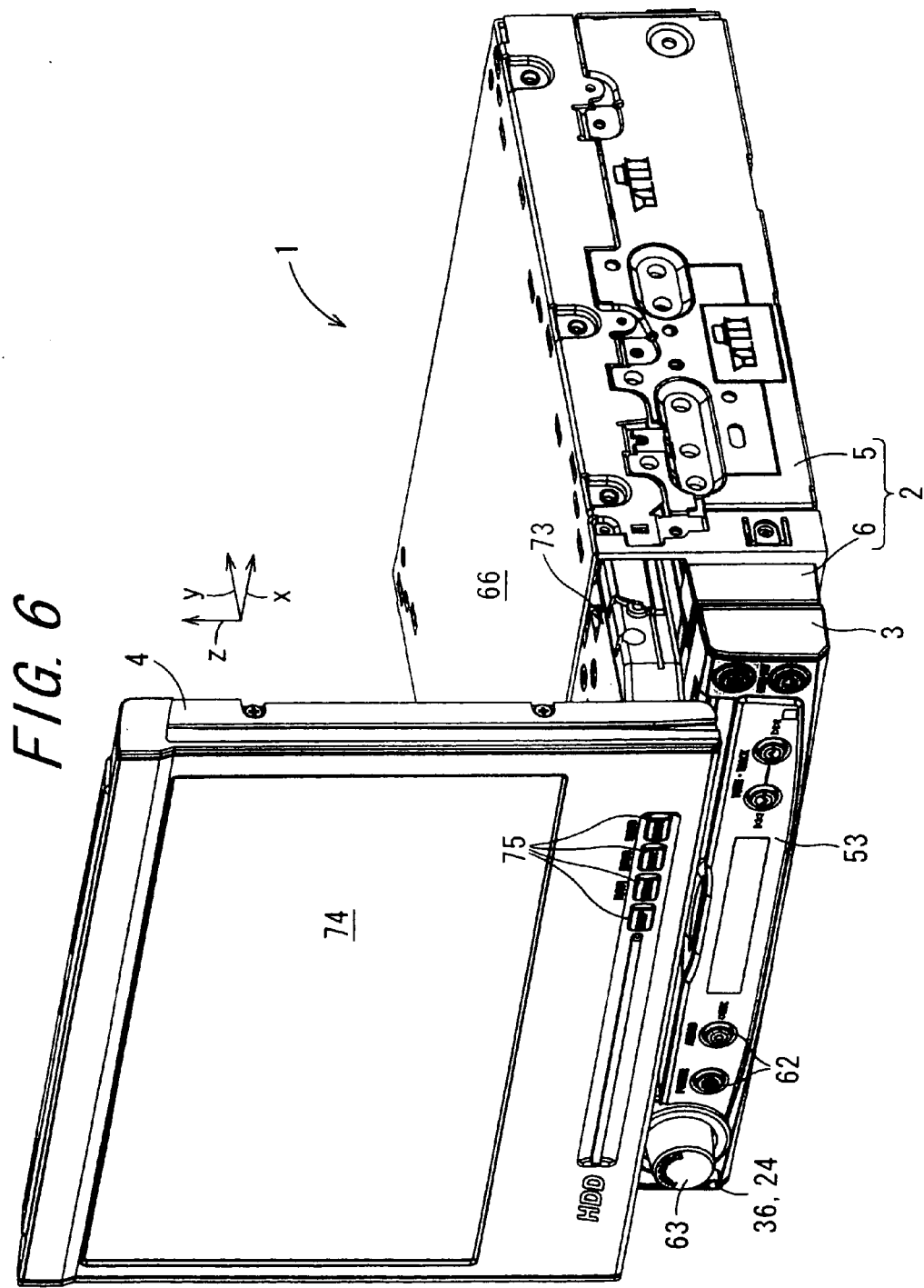
FIG. 6 is a perspective view showing the vehicle-mounted electronic apparatus, with its display panel unit kept in an opened state.

FIG. 1 is a perspective view of a vehicle-mounted electronic apparatus 1 according to one embodiment of the invention. FIG. 2 is a perspective view showing the vehicle-mounted electronic apparatus 1, with its detachable panel unit 3 removed. FIG. 3 is a front view of the vehicle-mounted electronic apparatus 1. FIG. 4 is a front view showing the vehicle-mounted electronic apparatus 1, with its detachable panel unit 3 removed. FIG. 5 is a bottom view of the vehicle-mounted electronic apparatus 1. FIG. 6 is a perspective view showing the electronic apparatus 1, with its display panel unit 4 kept in an opened state. The vehicle-mounted electronic apparatus 1 (which may be hereinafter referred to as simply an "electronic apparatus 1") concerning the embodiment is designed to be applicable to an audio visual navigation system of the 1 DIN standard. The electronic apparatus 1 is mainly composed of an electronic apparatus main body 2, the detachable panel unit 3 built as an operation section, and a display panel unit 4 serving as a display section. In the relevant figures, a direction of the depth of the electronic apparatus main body 2 is defined as a y direction, a direction of the height thereof is defined as a z direction, and a direction perpendicular to the directions y and z is defined as an x direction. The x direction, the y direction, and the z direction are each indicated by an arrow. The x direction-wise dimension, the y direction-wise dimension, and the z direction-wise dimension of the 1 DIN-sized electronic apparatus 1 concerning the embodiment are set at approximately 170 mm, 190 mm, and 47 mm, respectively. The electronic apparatus main body 2 is composed of an apparatus body unit 5 and a base panel unit 6.

Figure 7:
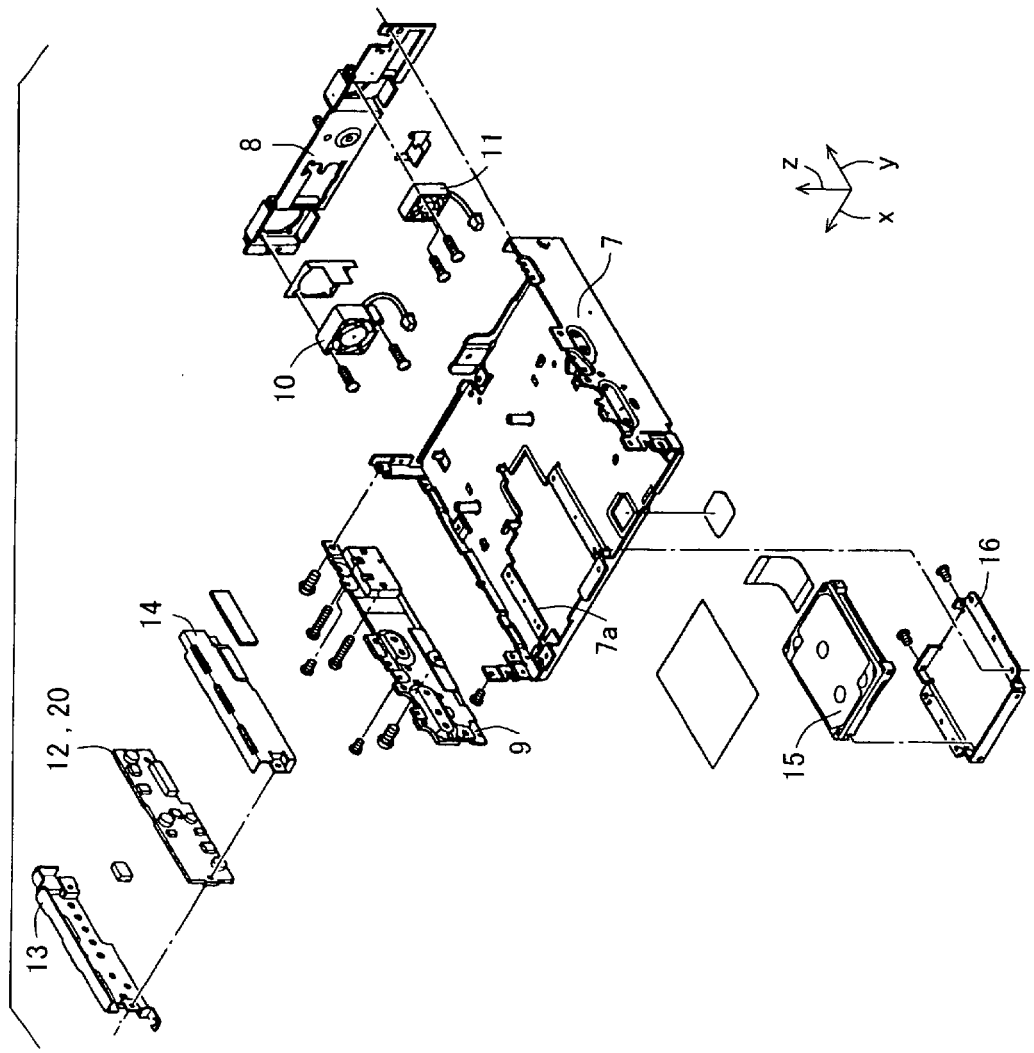
FIG. 7 is an exploded perspective view showing a main part of an apparatus body unit of the vehicle-mounted electronic apparatus.
Figure 8:
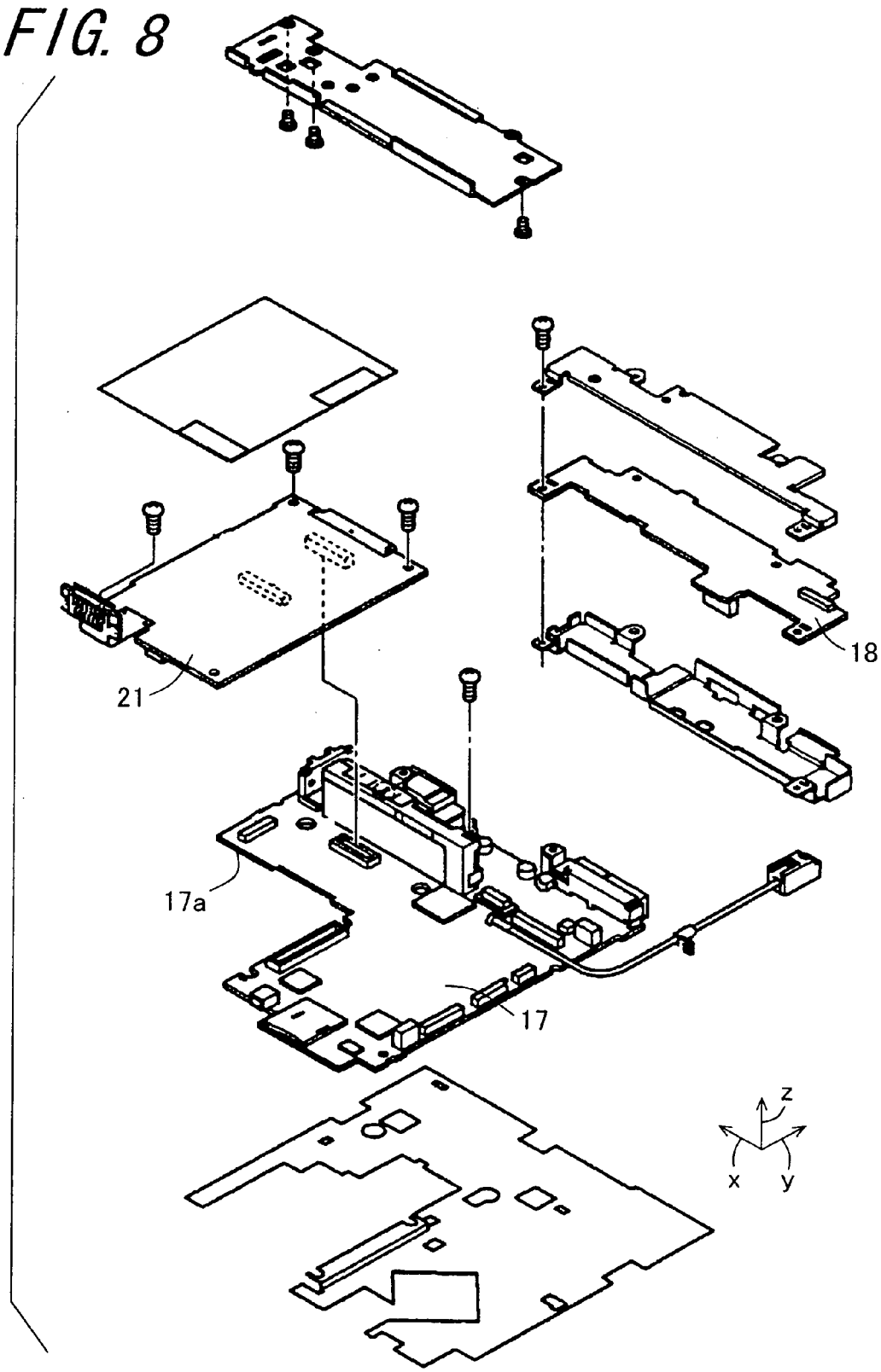
FIG. 8 is an exploded perspective view showing the constituent components such as a board that are disposed in the apparatus body unit of the vehicle-mounted electronic apparatus.

Now, the apparatus body unit 5 will be explained with reference to FIGS. 7 and 8, and in addition FIGS. 1 through 6 and 9. FIG. 7 is an exploded perspective view showing a main part of the apparatus body unit 5 of the electronic apparatus 1. FIG. 8 is an exploded perspective view showing the constituent components such as a board that are disposed in the apparatus body unit 5 of the electronic apparatus 1. As shown in FIG. 7, the apparatus body unit 5 is composed of a main chassis 7 serving as a casing, a rear chassis 8, a heat sink 9 built as a heat dissipating plate, a first and a second fan 10 and 11, a DC/DC converter 12, a pair of holders 13 and 14 for holding the DC/DC converter 12 (herein referred to as a "DC/DC converter holder"), a hard disk drive 15 (HDD for short) serving as a storage medium, and a holder 16 for holding the hard disk drive 15 (herein referred to as a "HDD holder 16"). The main chassis 7 constitutes a main body unit. Moreover, as shown in FIG. 8, the apparatus body unit 5 is further provided with a navigation board 17 serving as a first board, a pre-out board 18, an MCM board (multichip module board) 21 serving as a second board and an audio board, a DC/DC converter board 20, and shielding plates of various type.

With respect to the main chassis 7, at one side edge in the x direction thereof, the heat sink 9 is provided in an upright manner so as to lie in a y-z plane, and at one side edge in the y direction thereof, the rear chassis 8 is provided in an upright manner so as to lie in an x-z plane. One end in the x direction of the rear chassis 8 is equipped with the first fan 10 for cooling mainly the MCM board 21 and the DC/DC converter board 20 by exhausting cool air, and the other end in the x direction of the rear chassis 8 is equipped with the second fan 11 for cooling mainly the navigation board 17 by exhausting cool air. The first and second fans 10 and 11 will occasionally be referred to as a "double fan". In this embodiment, the double fan is arranged face to face with the HDD 15, a CPU (Central Processing Unit), and a power amplifier, each of which generates a larger amount of heat. This arrangement helps enhance the effect of heat dissipation. Moreover, considering that the CPU is the origin of digital noise in a non-illustrated digital circuitry section, by spacing apart the CPU and a tuner as will be mentioned later on, it is possible to minimize the influence of noise.

In the main chassis 7, the DC/DC converter 12 received by the DC/DC converter holder 13, 14 is retained at one end in the x direction thereof in the vicinity of the heat sink 9. As shown in FIGS. 5 and 7, the main chassis 7 is provided with a hole 7a that is an opening portion for housing the HDD 15. Through the hole 7a, the HDD 15, the recorded data of which may vary from destination to destination, and the HDD holder 16 are inserted so that they can be housed in the bottom portion of the electronic apparatus 1. In order to serve the purposes of, for example, coping with the crash of an HDD, allowing replacement of an existing HDD before it approaches the end of its life cycle, and exchanging a HDD for the one of higher storage capacity, the HDD 15 and the HDD holder 16 are designed to be exchangeable through the hole 7a.

The MCM board 21 is disposed as if to occupy one area in the x direction of the main chassis 7. The MCM board 21 is constructed of a DSP (Digital Signal Processor) board serving as an audio section in combination with, for example, a music juke serving as a recording section for automatically recording music data on the HDD 15. In contrast to a conventional construction in which a DSP board and a music juke are provided independently of each other, the use of such an MCM board 21 makes it possible to achieve miniaturization of the electronic apparatus 1, to reduce the number of constituent components, and to effect takt time saving. Moreover, the navigation board 17 is disposed as if to occupy most part of the other area in the x direction and a part of one area in the x direction on the main chassis 7. In the navigation board 17, an avoiding portion is formed for avoiding interference with the HDD 15, which avoiding portion is realized by a cutout portion 17a.

The pre-out board 18 is also referred to as a "sub board 18". The specification of the sub board 18, for example, the presence or absence of a tuner, is determined in accordance with the place of destination. The sub board 18 is disposed along one side edge in the z direction of the rear chassis 8. The sub board 18, the rear chassis 8, the main chassis 7, the heat sink 9, and others constitute a substantially air-tightly sealed space. Moreover, while the time the display panel unit 4 is in an opened state, the MCM board 21 and the navigation board 17 have their one sides in the z direction exposed. This allows air to flow from the MCM board 21 and the DC/DC converter board 20 to the first fan 10, as well as from the navigation board 17 to the second fan 11, in an efficient manner. In other words, the MCM board 21 and the DC/DC converter board 20 are located in one area in the x direction of the main chassis 7 so as to face the first fan 10, whereas the navigation board 17 is located in the other area in the x direction of the main chassis 7 so as to face the second fan 11. With this arrangement, the MCM board 21, the DC/DC converter board 20, and the navigation board 17 can be cooled individually by the cool-air exhausting action of the fan, wherefore the heat-generating constituent components undergo cooling in an efficient manner.

Figure 9:
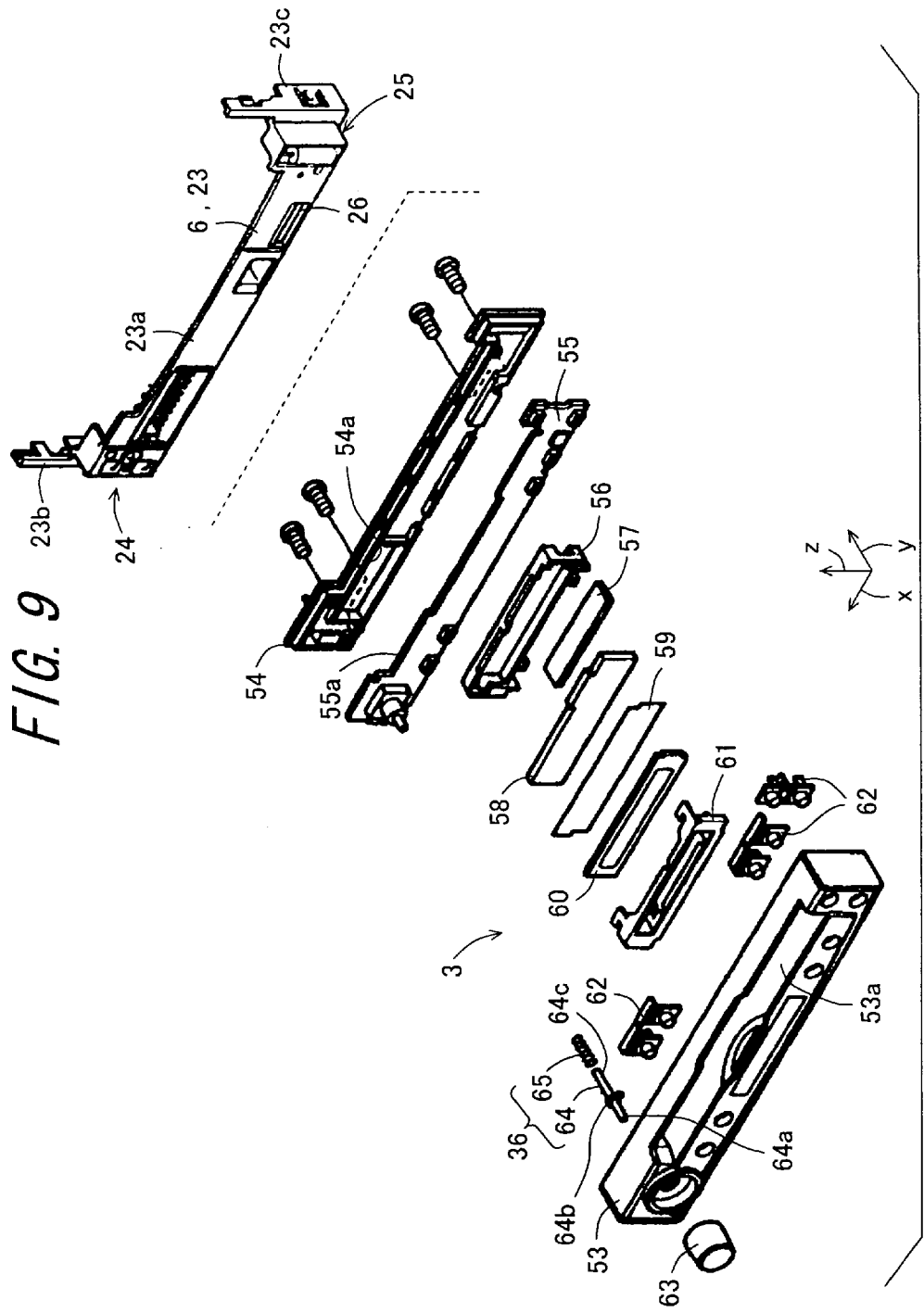
FIG. 9 is a perspective view showing the relationship between a base panel unit and the detachable panel unit.
Figure 10:
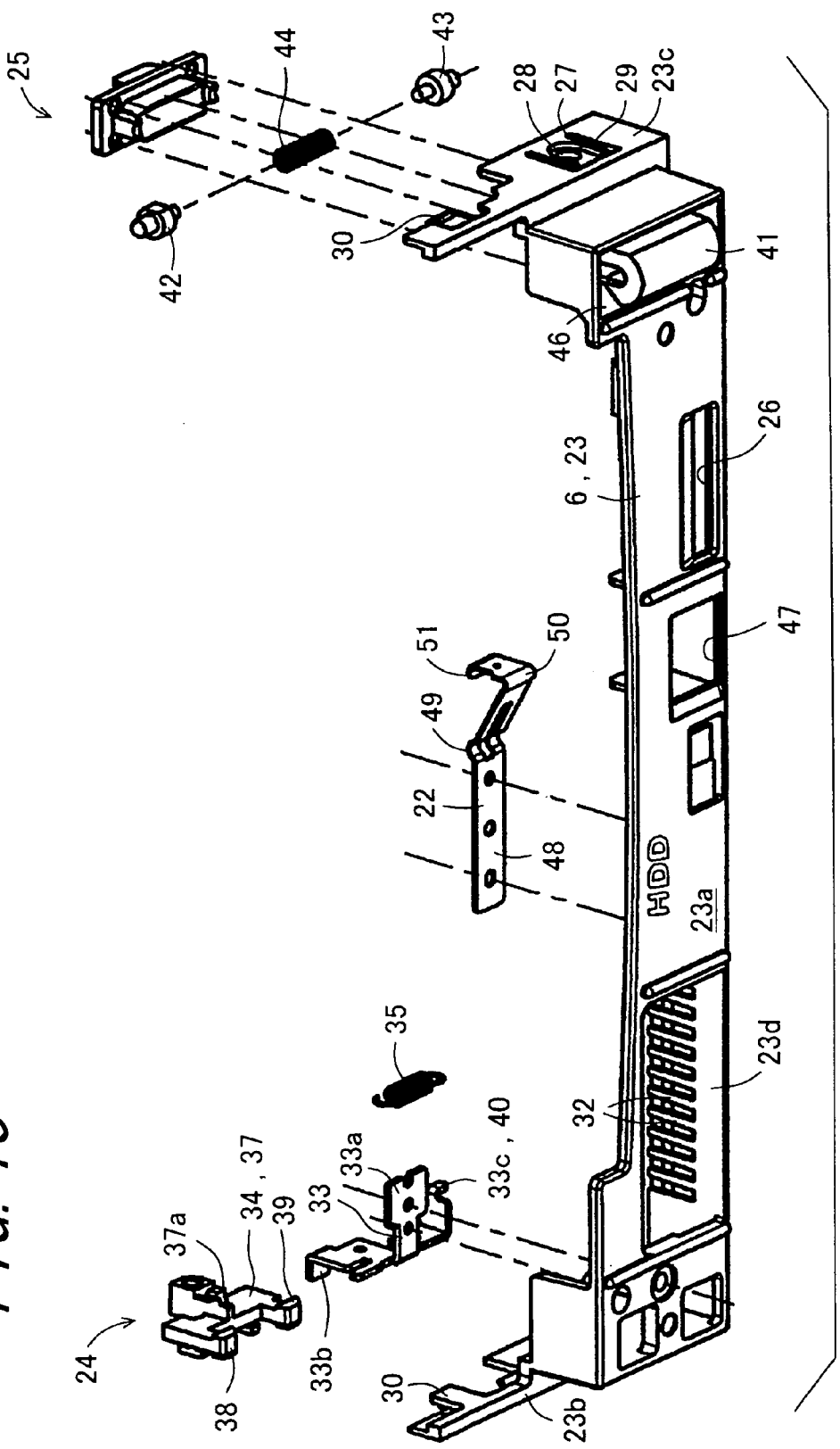
FIG. 10 is an exploded perspective view showing the base panel unit.
Figure 11:
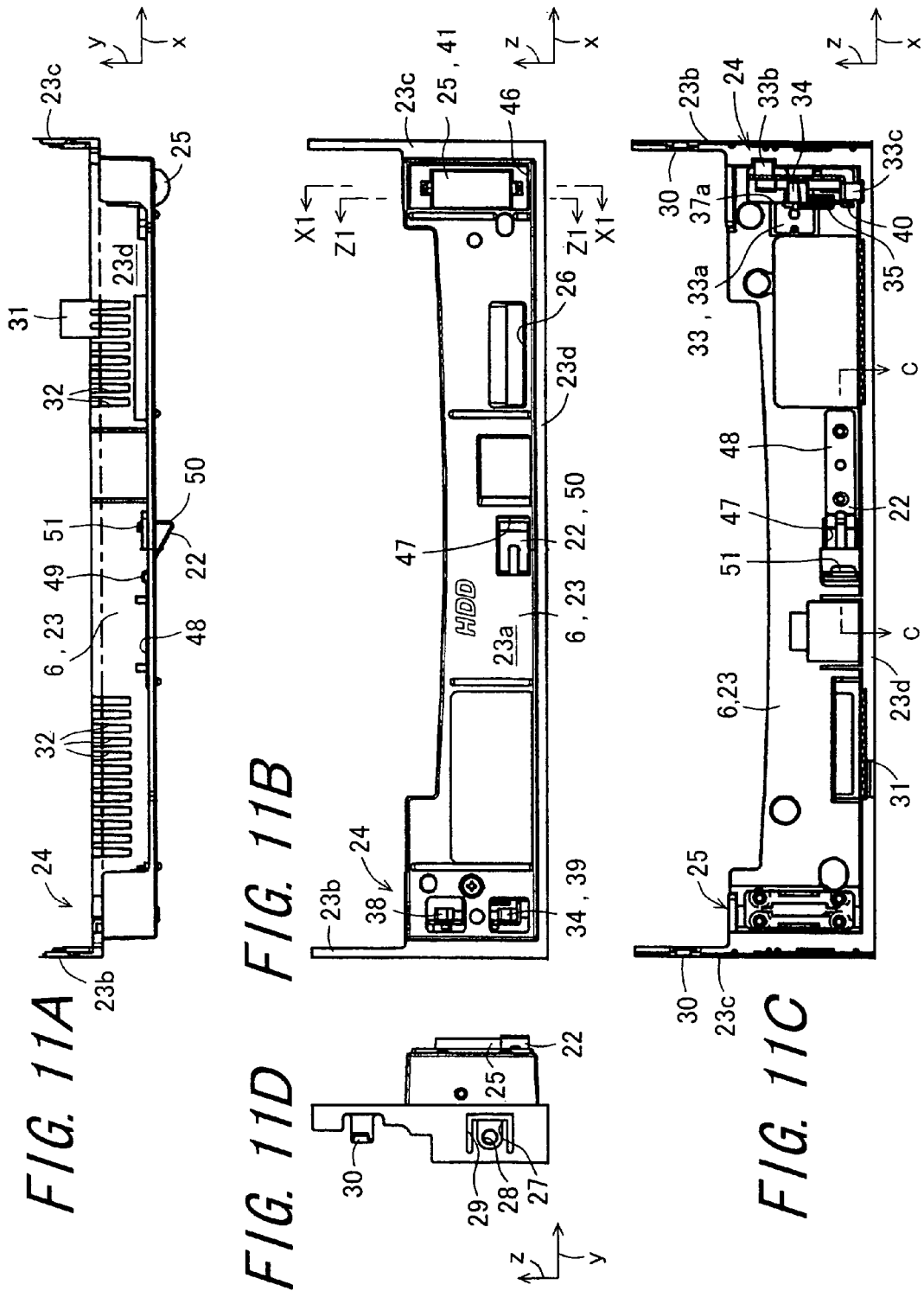
FIGS. 11A through 11D are views of the base panel unit, with FIG. 11A showing a plan view, FIG. 11B showing a front view, FIG. 11C showing a rear view, and FIG. 11D showing a side view.
Figure 12:
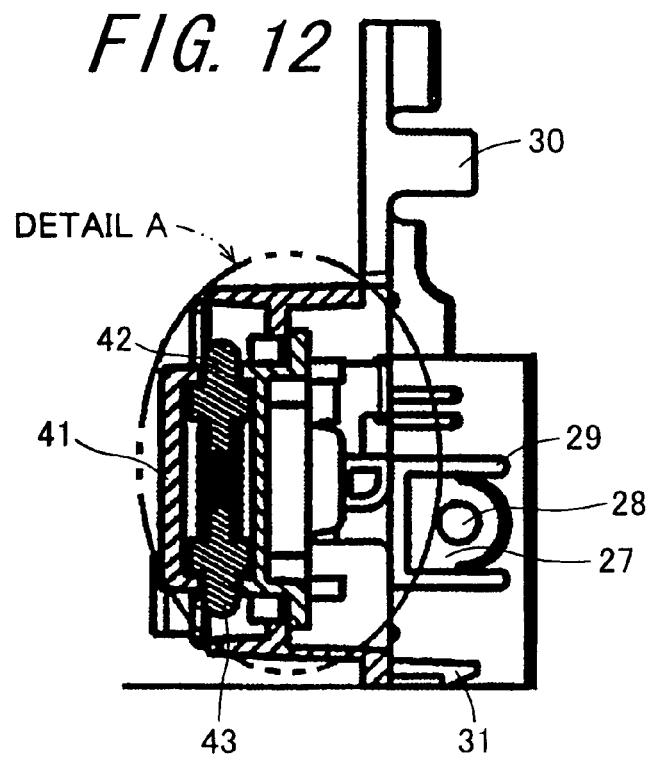
FIG. 12 is a sectional view taken along the line X-X of FIG. 11B.
Figure 13:
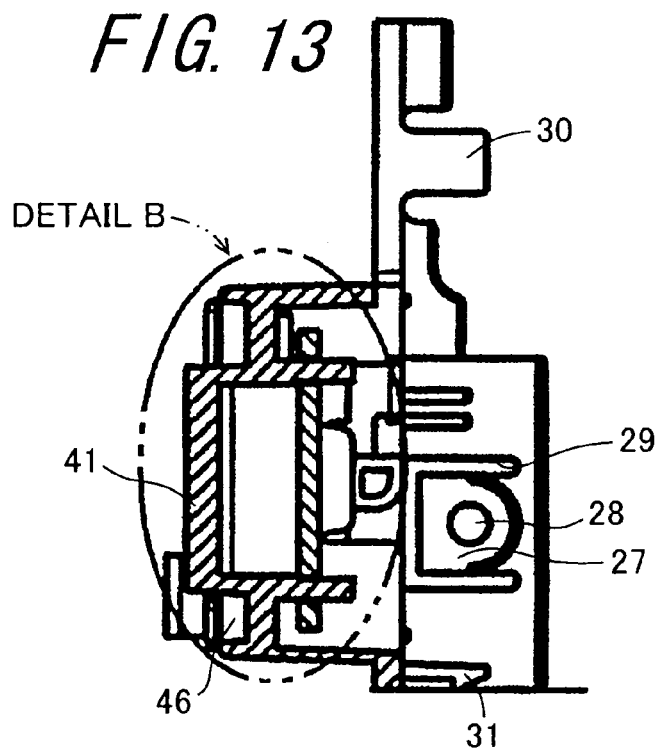
FIG. 13 is a sectional view taken along the line Z-Z of FIG. 11B.
Figure 14:
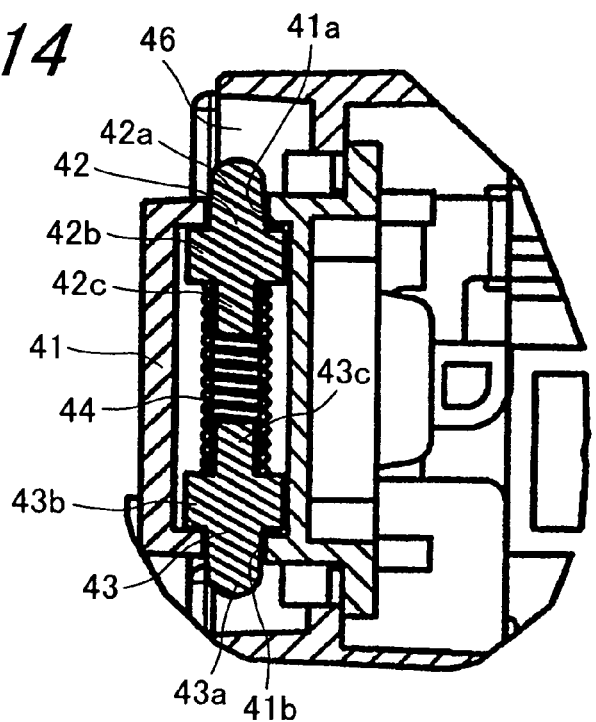
FIG. 14 is an enlarged sectional view showing DETAIL A of FIG. 12.
Figure 15:
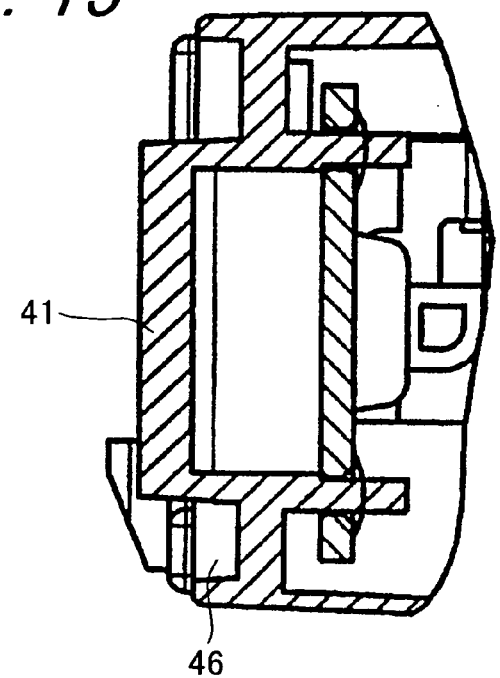
FIG. 15 is an enlarged sectional view showing DETAIL B of FIG. 13.
Figure 16:
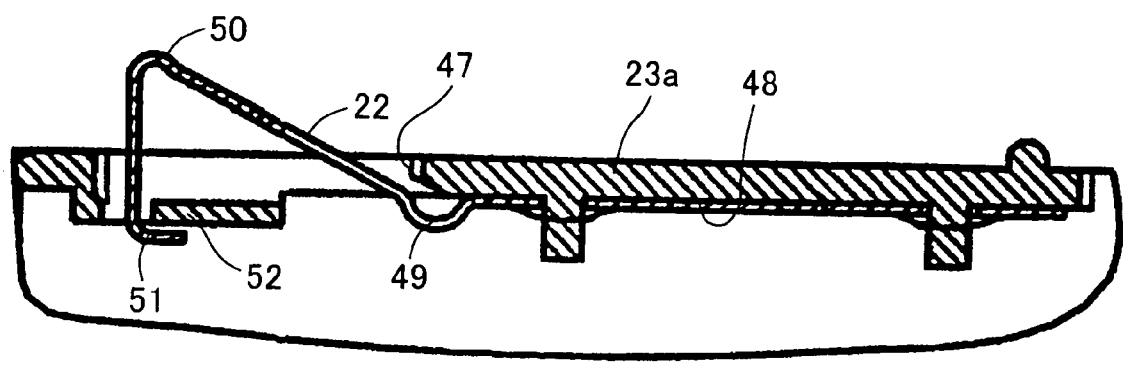
FIG. 16 is an enlarged sectional view showing a leaf spring in a fixed state.

Next, the base panel unit 6 will be explained. FIG. 9 is a perspective view showing the relationship between the base panel unit 6 and the detachable panel unit 3. FIG. 10 is an exploded perspective view showing the base panel unit 6. FIGS. 11A through 11D are views of the base panel unit 6, with FIG. 11A showing a plan view, FIG. 11B showing a front view, FIG. 11C showing a rear view, and FIG. 11D showing a side view. FIG. 12 is a sectional view taken along the line X-X of FIG. 11B. FIG. 13 is a sectional view taken along the line Z-Z of FIG. 11B. FIG. 14 is an enlarged sectional view showing DETAIL A of FIG. 12. FIG. 15 is an enlarged sectional view showing DETAIL B of FIG. 13. FIG. 16 is an enlarged sectional view showing a leaf spring 22 in a fixed state.

The base panel unit 6, which allows attachment and detachment of the detachable panel unit 3, is disposed at one side edge in the y direction of the main chassis 7 so as to lie in the x-z plane. The base panel unit 6 is composed of a panel main body 23, a first lock mechanism 24, a second lock mechanism 25, and the leaf spring 22 acting as press means. The panel main body 23 includes a front wall portion 23a, one side wall portion 23b, the other side wall portion 23c, and a bottom wall portion 23d that are formed of synthetic resin, for instance, in a single-piece construction. The front wall portion 23a is so formed as to lie in the x-z plane, whereas one side wall portion 23b and the other side wall portion 23c are so formed as to lie in an x-y plane. One side wall portion 23b is fitted to one end in a longitudinal direction of the front wall portion 23a, whereas the other side wall portion 23c is fitted to the other end in the longitudinal direction of the front wall portion 23a. The front wall portion 23a is provided with a slot 26 that is an insertion/ejection port for inserting a semiconductor memory serving as a second medium, for example, a memory stick. Note that the semiconductor memory is not limited to the memory stick, but maybe other semiconductor memories such as an SD memory card and a compact flash memory card. One and the other side wall portions 23b and 23c are identical in configuration. Accordingly, no description will be given separately as to the other side wall portion 23c, while its constituent components bear the same reference symbols as those of one side wall portion 23b.

At the base end of one side wall portion 23b are formed a counterbored portion 27 and a screw hole 28, and in addition a U-shaped slit 29. With the U-shaped slit 29, the base end having the screw hole 28 is elastically deformable in such a manner as to become warped inwardly in the x direction. At the front end of one side wall portion 23b is formed a pawl 30 which protrudes by a predetermined short distance in one y direction. At one side edge in the y direction of the bottom wall portion 23d is also formed a pawl 31 which protrudes by a predetermined short distance in one y direction. A plurality of the pawls 30 and 31 are engaged with their respective parts of the main chassis 7, and a non-illustrated screw inserted through the screw hole 28 is screwed up against a non-illustrated screw portion formed in the main chassis 7. Moreover, in the bottom wall portion 23d, heat-dissipating slits 32 are so formed as to extend in the y direction. The slits 32 are spaced a predetermined interval apart in the x direction.

The first lock mechanism 24 is so formed as to extend over one end in the longitudinal direction of the front wall portion 23a, one side wall portion 23b, and the bottom wall portion 23d. The first lock mechanism 24 is composed of a stationary holder 33, a movable holder 34, an extension coil spring 35, and a press mechanism 36 of the detachable panel unit 3 which will be described later on. The stationary holder 33 includes a projection 33a, a first retention portion 33b, and a second retention potion 33c. The projection 33a is fastened to the front wall portion 23a. The first retention portion 33b is fastened to one side wall portion 23b. The second retention potion 33c is fastened to the bottom wall portion 23d. The movable holder 34 is slidably supported on the stationary holder 33. Specifically, the movable holder 34 is composed of a movable holder main body 37, a first engagement portion 38, and a second engagement portion 39. A hook piece 37a is annexed to the movable holder main body 37. A hook portion 40 is annexed to the second retention potion 33c. The extension coil spring 35 is disposed across the hook piece 37a and the hook portion 40. The extension coil spring 35 provides a resilient biasing force tending to move the movable holder 34 toward the stationary holder 33 in the direction of the bottom wall portion 23d. In each of the first and second engagement portions 38 and 39, the front end is formed with a taper portion which is inclined to one side in the y direction with respect to one z direction. The tapered front end causes, when pressed by part of the press mechanism 36 of the detachable panel unit 3, the movable holder 34 to move in the z direction under the resilient biasing force exerted by the extension coil spring 35. In this way, the first lock mechanism 24 is brought into an unlocked state.

The second lock mechanism 25 is disposed at the other end in the longitudinal direction of the front wall portion 23a. The second lock mechanism 25 is composed of a lock pin housing member 41, a pair of lock pins 42 and 43, a compression coil spring 44, and an engagement member 45 of the detachable panel unit 3 that will be described later with reference to FIGS. 20A through 20C. At the other end in the longitudinal direction of the front wall portion 23a is formed a concavity 46 which extends somewhat in the z direction. The substantially cylindrically shaped lock pin housing member 41 is fastened to the concavity 46. The lock pin housing member 41 is so shaped as to protrude in part beyond the surface of the front wall portion 23a in the y direction. With respect to the lock pin housing member 41, at opposite ends in the z direction thereof, holes 41a and 41b are formed through which an engagement pin 42a of the lock pin 42 and an engagement pin 43a of the lock pin 43 protrude, respectively. That is, in the lock pin housing member 41, the pair of lock pins 42 and 43 are spaced apart oppositely in the z direction.

The lock pin 42, 43 is composed of the engagement pin 42a, 43a, a flange 42b, 43b, and a spring support shaft 42c, 43c that are arranged in the order named along the z direction. The spring support shafts 42c and 43c of the pair of lock pins 42 and 43 are coaxially arranged spacedly in a face-to-face manner. The compression coil spring 44 is fitted exteriorly of the spring support shafts 42c and 43c. The compression coil spring 44 is disposed in such a manner as to abut against both of the flanges 42b and 43b under its resilient biasing force. That is, under the resilient biasing force exerted by the compression coil spring 44, the engagement pins 42a and 43a of the pair of lock pins 42 and 43 are caused to jut out from the holes 41a and 41b of the lock pin housing member 41, respectively. The engagement member 45 of the detachable panel unit 3 is made engageable with the engagement pins 42a and 43a. Moreover, the engagement member 45 is made detachable from the engagement pins 42a and 43a under the resilient biasing force exerted by the compression coil spring 44. By dint of the first and second lock mechanisms 24 and 25 thus far described, the detachable panel unit 3 can be kept attached to the electronic apparatus main body 2 with stability.

The leaf spring 22 serves as press means. Upon the first lock mechanism 24 being unlocked, the leaf spring 22 presses the detachable panel unit 3 to cause it to change from an attached state to a detached state. With respect to the front wall portion 23a, in a midportion in the x direction thereof, a hole 47 is formed through which a part of the leaf spring 22 protrudes. The leaf spring 22 includes a supporting portion 48, a flexural portion 49, a press portion 50, and a retention portion 51. These components constituting the leaf spring 22 are made of copper phosphate, for instance. However, the leaf spring 22 is not limited to copper phosphate, but may be of another material such as stainless steel. The supporting portion 48 is welded to the back surface of the front wall portion 23a. The press portion 50 juts out through the hole 47 from the flexural portion 49. With the press portion 50 kept protrusive to the fullest extent possible, the retention portion 51 is engaged to a to-be-engaged portion 52 of the front wall portion 23a.

In this way, upon the first lock mechanism 24 being unlocked, the press portion 50 of the leaf spring 22 juts out through the hole 47 under its springy force, thereby pressing the detachable panel unit 3 to cause it to change from an attached state to a detached state. With the first and second lock mechanisms 24 and 25 kept in a locked state, a backlash between the detachable panel unit 3 and the base panel unit 6 can be suppressed successfully under the springy force of the leaf spring 22. Upon the detachable panel unit 3 being placed in a detached state, the slot 26 for inserting a memory stick is exposed, thereby allowing attachment and detachment of memory stick. In other words, since a memory stick is not used on a regular basis, the attachment and detachment of memory stick cannot be achieved without bringing the detachable panel unit 3 into a detached state.

Figure 17:
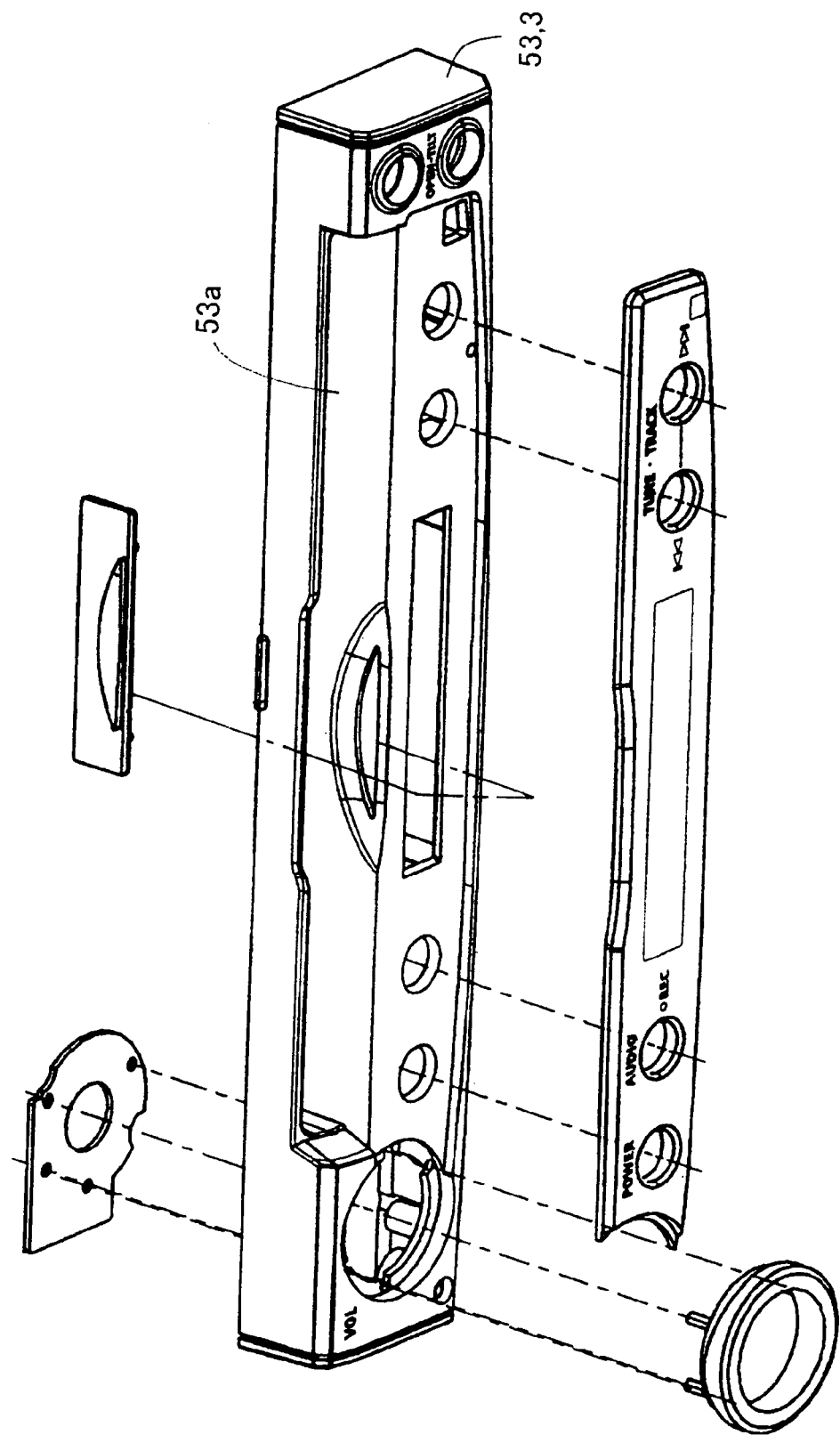
FIG. 17 is an exploded perspective view showing a main part of the detachable panel unit.
Figure 18A:
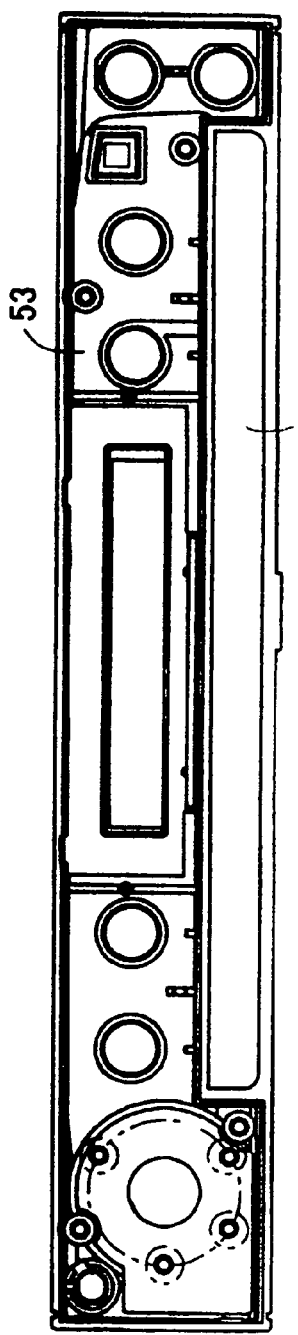
FIGS. 18A through 18C are views of a front face of the detachable panel unit, with FIG. 18A showing a rear view, FIG. 18B showing a plan view, and FIG. 18C showing a front view.
Figure 18B:
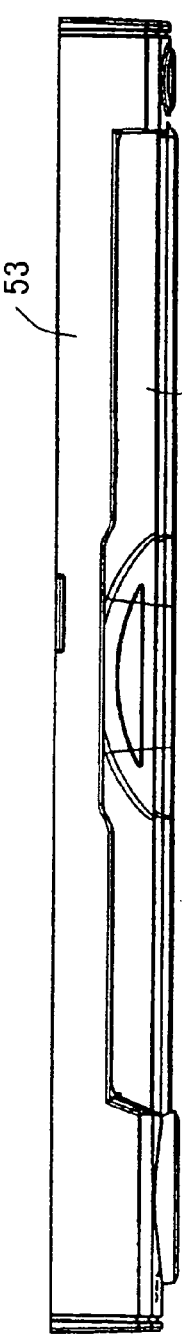
Figure 18C:
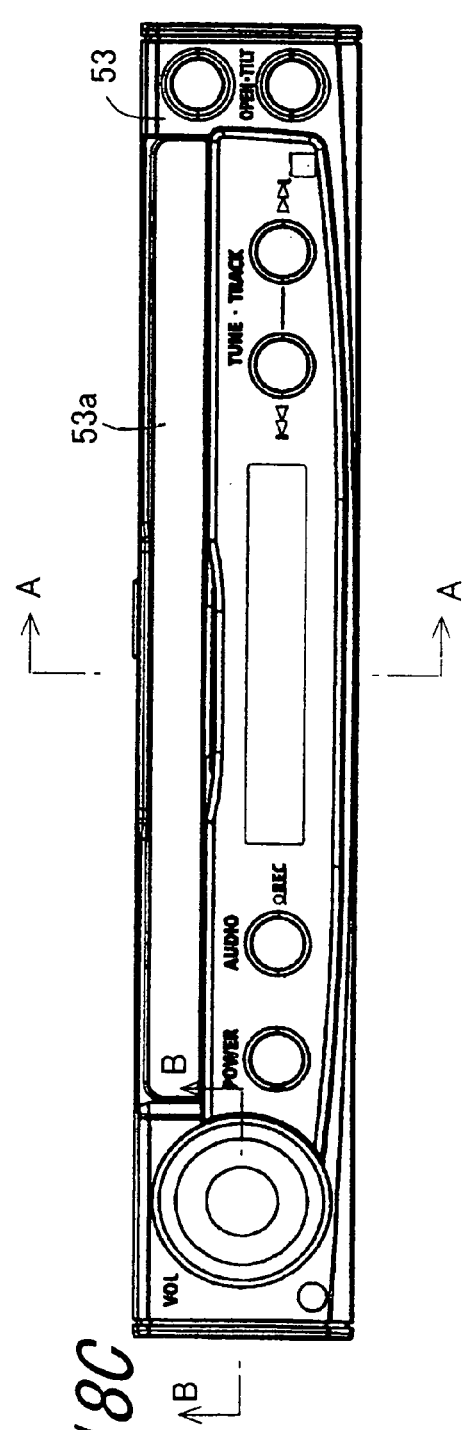
Figure 19:
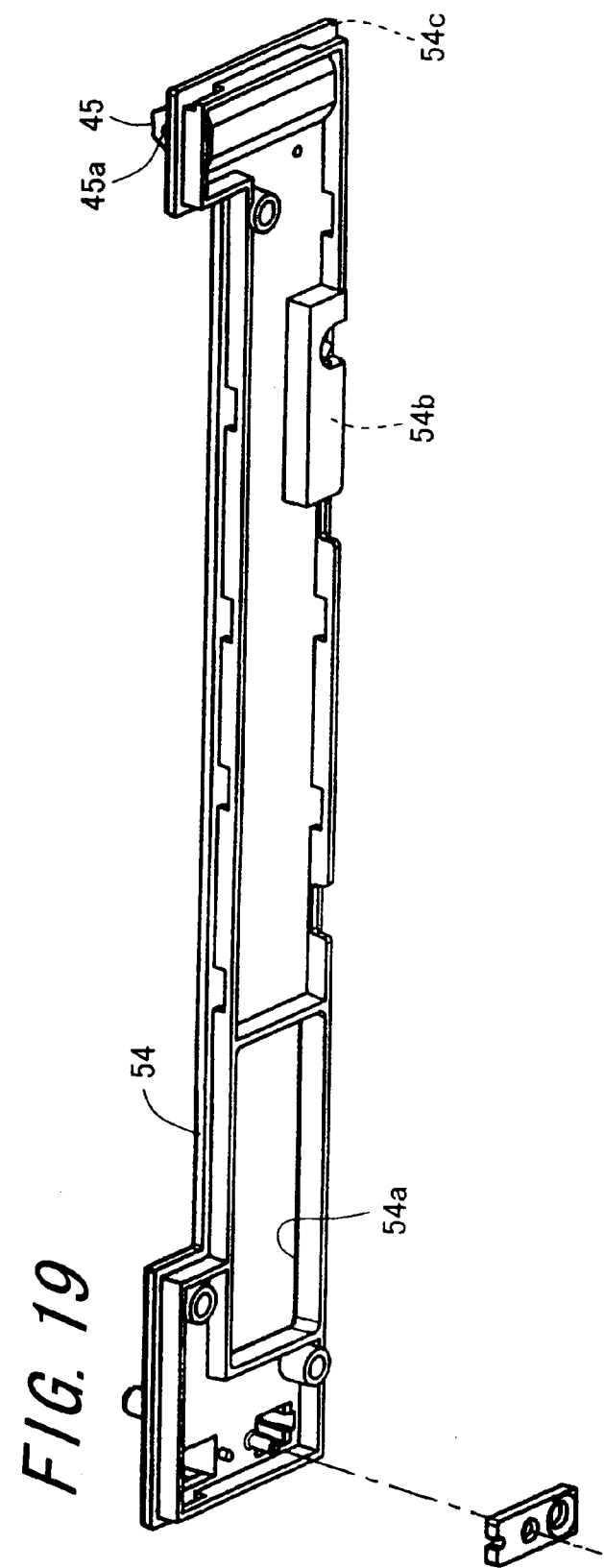
FIG. 19 is a perspective view showing a back face of the detachable panel unit.
Figure 20A:
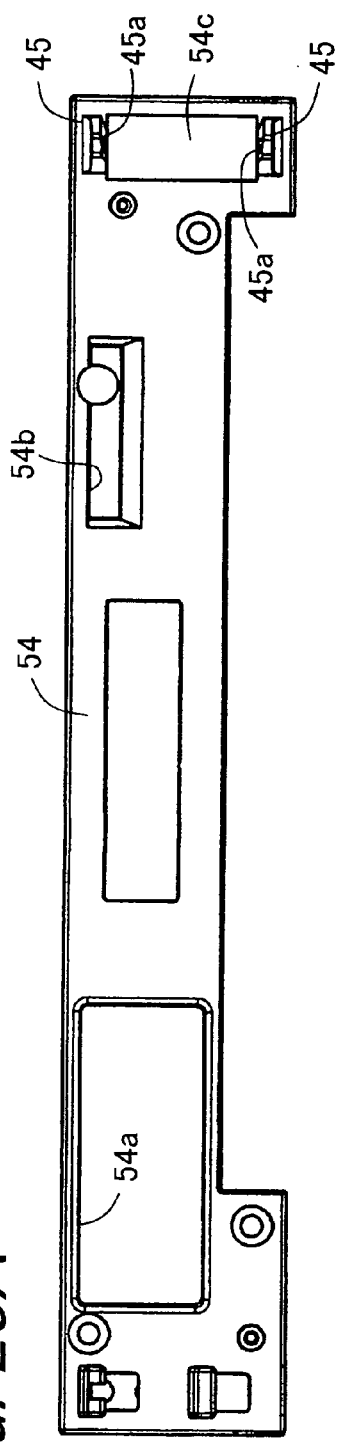
FIGS. 20A through 20C are views of the back face of the detachable panel unit, with FIG. 20A showing a front view, FIG. 20B showing a plan view, and FIG. 20C showing a rear view.
Figure 20B:
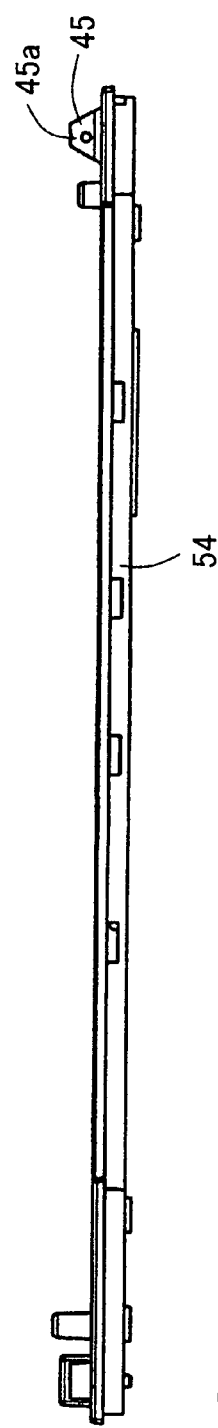
Figure 20C:
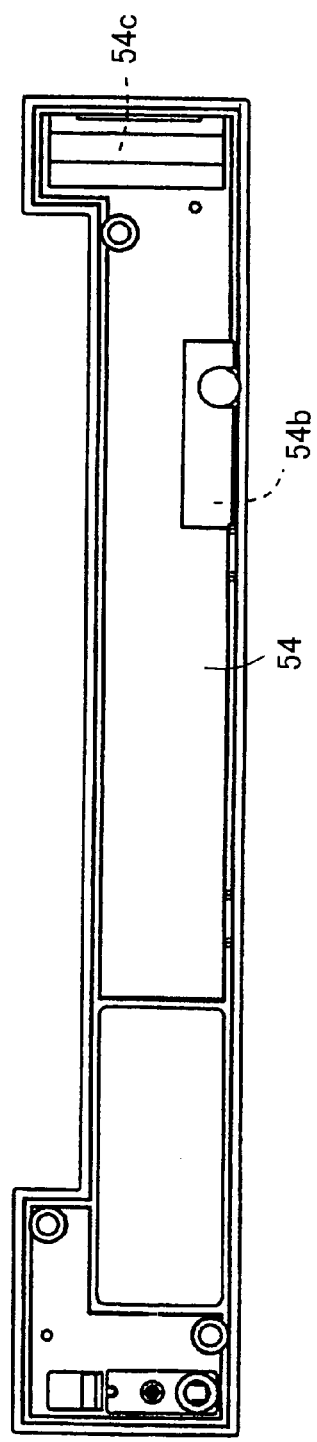

FIG. 17 is an exploded perspective view showing a main part of the detachable panel unit 3. FIGS. 18A through 18C are views of a front face 53 of the detachable panel unit 3, with FIG. 18A showing a rear view, FIG. 18B showing a plan view, and FIG. 18C showing a front view. FIG. 19 is a perspective view showing a back face 54 of the detachable panel unit 3. FIGS. 20A through 20C are views of the back face 54 of the detachable panel unit 3, with FIG. 20A showing a front view, FIG. 20B showing a plan view, and FIG. 20C showing a rear view.

Now, the detachable panel unit 3 will be explained. The detachable panel unit 3 is composed of a detachable front assembly 53 (the front face 53), a detachable back assembly 54 (the back face 54), a panel board 55, a light guide plate case 56, a spacer 57, a LCD (Liquid Crystal Display) light guide plate 58, a LCD diffusion plate 59, a display unit 60 including LCD, a LCD holder 61, various buttons 62, a knob 63, the press mechanism 36, and the engagement member 45. The detachable front assembly 53 and the detachable back assembly 54 are fastened to each other by means of a plurality of screws. Another components are held in the assembly formed by fastening the detachable front assembly 53 and the detachable back assembly 54 by means of a plurality of screws. The detachable front assembly 53 is provided with an insertion/ejection port 53a through which the first recording medium that is specifically an optical disk such as a compact disk (CD) can be inserted/ejected. By way of the insertion/ejection port 53a, the optical disk can be inserted or ejected through an optical disk insertion/ejection port disposed in the electronic apparatus main body 2. In other words, the optical disk insertion/ejection port of the electronic apparatus main body 2 is exposed from the insertion/ejection port 53a of the detachable panel unit 3.

The press mechanism 36 is designed to unlock the first lock mechanism 24. Included therein are a release button 64 and a compression coil spring 65. The release button 64, which is formed of a shaft member elongated by a predetermined small distance in the y direction, is composed of a base end 64a, a flange 64b, and a front end 64c. The base end 64a is so formed as to protrude slightly beyond the detachable front assembly 53 in the y direction for manual operations. The compression coil spring 65 is fitted exteriorly of the release button 64 so as to extend from the flange 64b to the front end 64c. The compression coil spring 65 provides a resilient biasing force tending to move the base end 64a in the y direction. The front end 64c is formed with a taper portion which is inclined to one side in the y direction with respect to one z direction. At the instant when a user presses the base end 64a under the resilient biasing force exerted by the compression coil spring 65, the taper portion acts to move the movable holder in the z direction while being in abutment with the tapered front end of the first lock mechanism 24. In this way, the first lock mechanism 24 is brought into an unlocked state.

The detachable back assembly 54 is provided with the engagement member 45, an opening 54a through which a connection terminal 55a of the panel board 55 is exposed, a concavity for avoiding interference with a memory stick (MS for short), i.e., a MS concavity 54b, and so forth. At one end in the longitudinal direction of the detachable back assembly 54 are arranged the engagement members 45 that are spaced apart oppositely in the z direction. Between the engagement members 45 is formed a concavity 54c for retaining part of the outer peripheral surface of the lock pin housing member 41. The engagement members 45 are each so shaped as to protrude slightly in the y direction and provided with a to-be-engaged portion 45a with which the engagement pins 42a and 43a are engageable. Note that the detachable panel unit 3 is provided with no insertion/ejection port for a memory stick.

Figure 21:
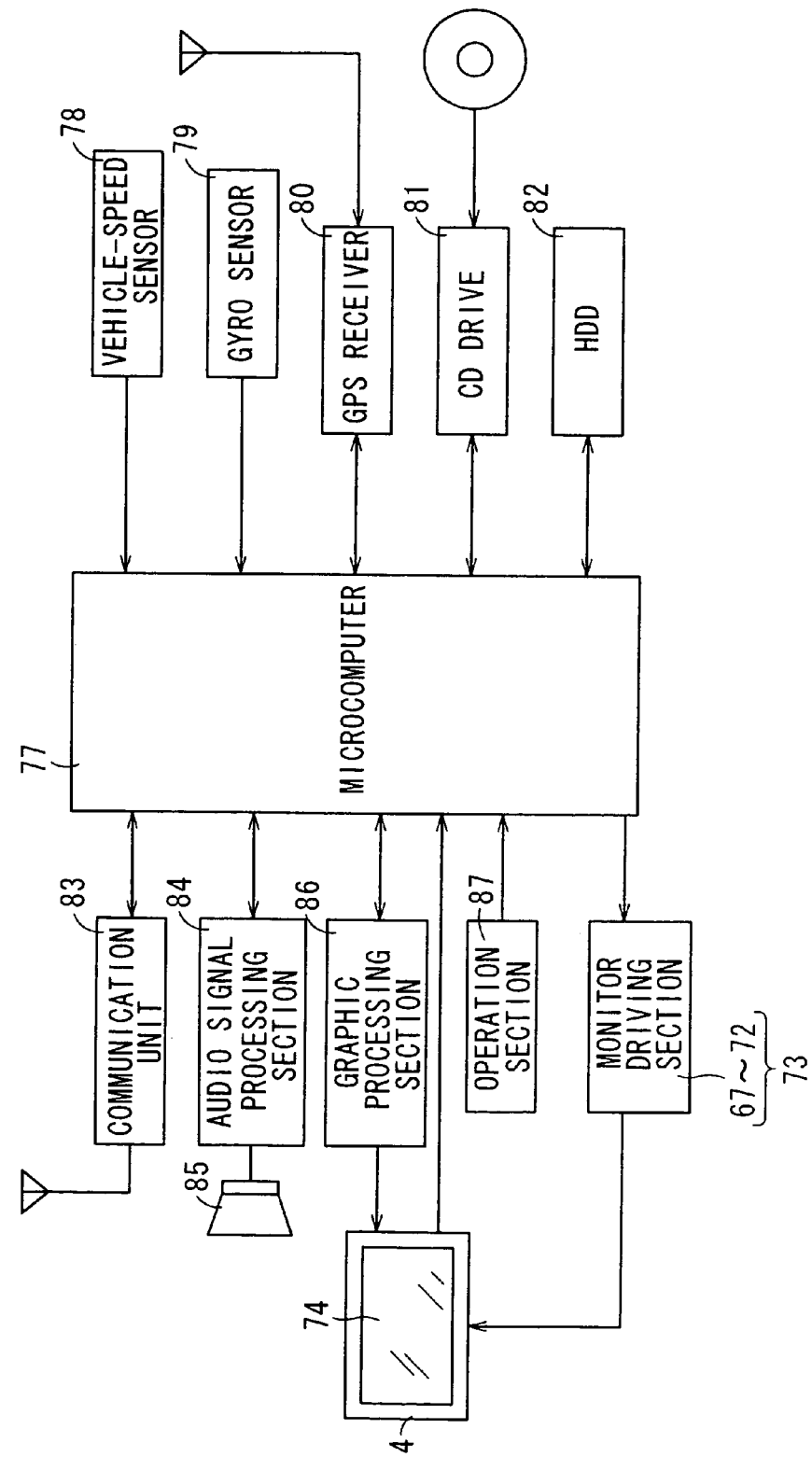
FIG. 21 is a block diagram showing the vehicle-mounted electrical configuration of the electronic apparatus.

Next, the display panel unit 4 will be explained with reference to FIG. 21. The display panel unit 4 is composed of a panel chassis 66 being shaped of a separate casing, a tilt mechanism 67, a slide mechanism 68, a gear mechanisms 69 and 70, driving sources 71 and 72, a TFT (Thin Film Transistor), a TFT holder, and a display board. The tilt mechanism 67, the slide mechanism 68, the gear mechanisms 69 and 70, and the driving sources 71 and 72 constitute a monitor driving section 73. The panel chassis 66 has a quadrilateral shape when viewed in the z direction, on which the other constituent components are supported. Specifically, the panel chassis 66 is provided with the tilt-inducing gear mechanism 69 for driving the tilt mechanism 67, the tilt-inducing driving source 71, the slide-inducing gear mechanism 70 for driving the slide mechanism 68, and the slide-inducing driving source 72. By the actions of the tilt-inducing gear mechanism 69 and the tilt-inducing driving source 71, the TFT, the TFT holder, and the display board (these constituent components will be collectively referred to as a "TFT liquid crystal display 74") can be driven to swing about the axis in the x direction. Moreover, by the actions of the slide-inducing gear mechanism 70 and the slide-inducing driving source 72, the TFT liquid crystal display 74 can be driven to move in the y direction relative to the panel chassis 66.

The display panel unit 4 thus far described is located at one part in the z direction, namely the upper part of the electronic apparatus main body 2. In the electronic apparatus main body 2, at one side edge in the y direction of the main chassis 7 is mounted the detachable panel unit 3, with the base panel unit 6 interposed there between. Accordingly, in contrast to the display panel unit 4, the detachable panel unit 3 acting as an operation section is located at the other part in the z direction, namely the lower part of the electronic apparatus main body 2. Since the TFT liquid crystal display 74 is driven to open upwardly, if, for example, the electronic apparatus 1 is so designed that the detachable panel unit 3 and the electronic apparatus main body 2 are located above the display panel unit 4, the detachable panel unit 3 cannot be operated while the time the TFT liquid crystal display 74 is in an opened state. For this reason, the detachable panel unit 3 is disposed under the display panel unit 4.

According to the 1 DIN standard, a z direction-wise space, namely a heightwise space is strictly limited, whereas a y direction-wise space, namely a depthwise space is relatively flexible in its size. Moreover, the TFT liquid crystal display 74 of the display panel unit 4 is so designed that the x direction-wise dimension is longer than the y direction-wise dimension. In light of the foregoing, operation buttons (the buttons 62 of the detachable panel unit 3) are arranged in a location below the TFT liquid crystal display 74 so that they can be operated to carry out necessary operations while the time the TFT liquid crystal display 74 is in an opened state. In other words, as shown in FIG. 6, a plurality of operation buttons are divided between the detachable panel unit 3 and the display panel unit 4 (the operation buttons 62 and 75) according to function. This makes it possible to effect a required operation quickly, and thereby improve the ease-of-use of the apparatus. Note that the z direction-wise dimension (i.e. the thickness) of the display panel unit 4 relatively to that of a combination of the apparatus main body 2 and the detachable panel unit 3 is set at a ratio of approximately 7 to 11 under the condition that the TFT liquid crystal display 74 is in a retracted state. As described heretofore, the display panel unit 4 and the electronic apparatus main body 2 are constructed in the form of a two-divided casing. Moreover, a "HDD" display 76 (refer to FIG. 1) borne at the top of the monitor is controlled to glow while the time the TFT liquid crystal display 74 is in a retracted state.

Now, a description will be given below as to the electrical configuration of the vehicle-mounted electronic apparatus 1 concerning the embodiment. FIG. 21 is a block diagram showing the electrical configuration of the vehicle-mounted electronic apparatus 1. The electronic apparatus 1 is composed of a microcomputer 77, a vehicle-speed sensor 78, a gyro sensor 79, a GPS (Global Positioning System) receiver 80, a CD (Compact Disk) drive 81 acting as a reproducing section, a HDD 82, communication unit 83, an audio signal processing section 84, a speaker 85, a graphic processing section 86, an operation section 87 implemented by way of the detachable panel portion, the monitor driving section 73, and the TFT liquid crystal display 74. The micro 77 includes the CPU, a ROM (Read Only Memory), a RAM (Random Access Memory), a bus, and an input-output interface. The vehicle-speed sensor 78, the gyro sensor 79, the GPS receiver 80, the CD drive 81, the HDD 82, the communication unit 83, the audio signal processing section 84, the graphic processing section 86, the TFT liquid crystal display 74, the detachable panel portion 87, and the monitor driving section 73 are each electrically connected to the input-output interface.

Figure 22:
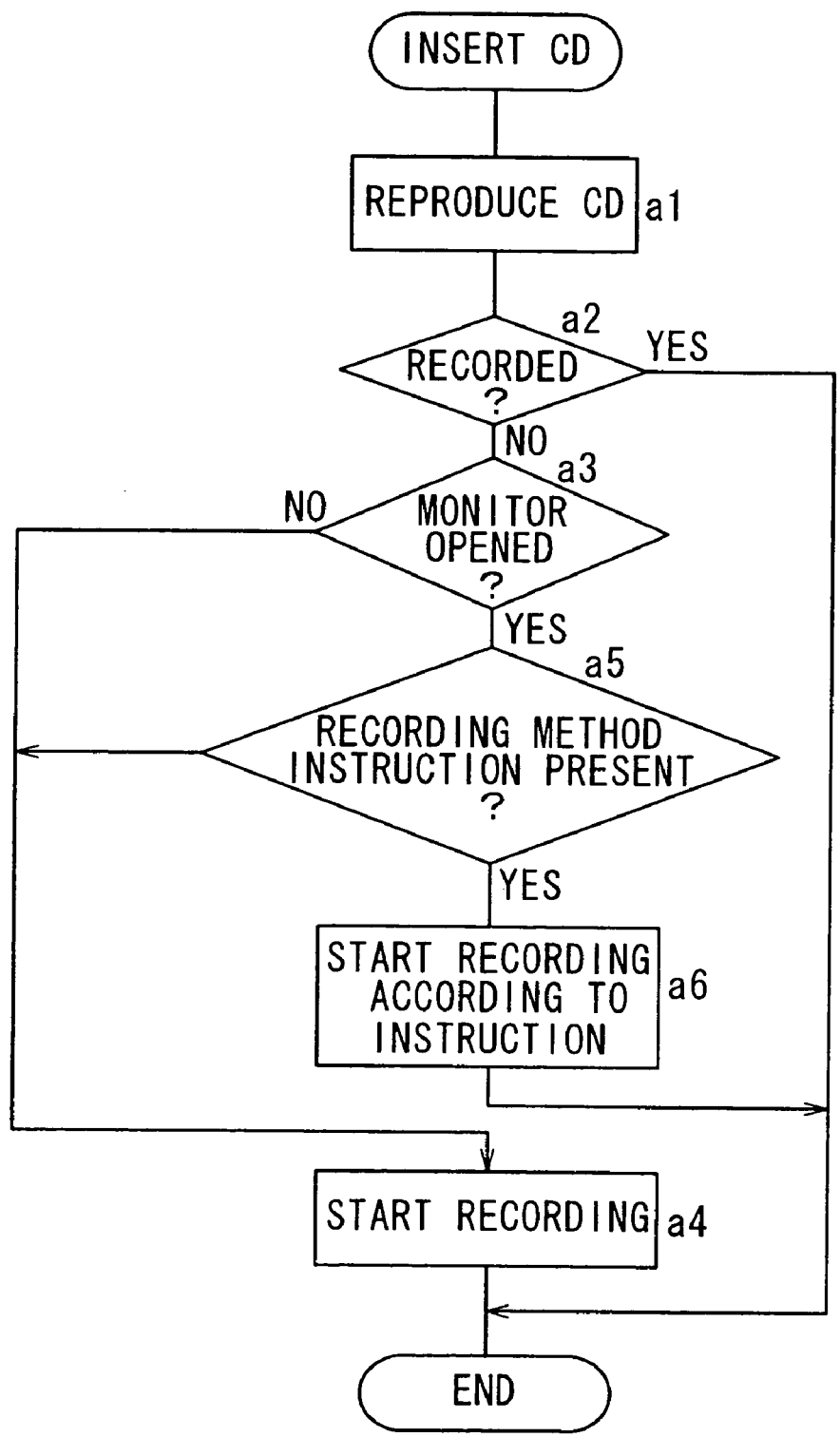
FIG. 22 is a flow chart showing the sequence of steps followed to carry out a CD recording operation.

FIG. 22 is a flow chart showing the sequence of steps followed to carry out a CD recording operation. A program for effecting the CD recording operation is stored in the ROM of the microcomputer 77 for example, so that recording is executed under the control of the CPU. In the flow chart, the CPU is illustrated as forming the nucleus of operation control unless otherwise specified. Note that the CD recording operation (i.e. recording of CD data on HDD) is carried out regardless of whether the TFT liquid crystal display 74 is placed in an opened state or in a retracted state. Upon a CD being inserted into the electronic apparatus 1 during power-up, the CD recording operation is started. At the outset, in Step a1, the data recorded on the CD is reproduced by driving the CD drive 81 and others.

Next, the procedure proceeds to Step a2 where it is checked whether the reproduced data has already been recorded or not. To be more specific, for example, the check is made through identification of the disk or music data on the basis of its performance time and the cue data represented as TOC (Table Of Contents) data. When it is determined that the data has already been recorded, the procedure comes to an end. When it is determined that the data has not yet been recorded, the procedure proceeds to Step a3 where it is checked whether the TFT liquid crystal display 74 is placed in an opened state or not. When it is determined that the TFT liquid crystal display 74 is not placed in an opened state, the procedure proceeds to Step a4 where CD-to-HDD recording is started. At this time, the recording operation is carried out at quadruple speed, for instance. Moreover, it is possible to effect simultaneous reproduction by utilizing the data read into the HDD. In a case where reproduction data and recording data can be read at high speed without delay in the CD player, yet-to-be-recorded data is also reproducible according to the principle of operation. Following the completion of the process in Step a4, the procedure comes to an end. On the other hand, in Step a3, when it is determined that the TFT liquid crystal display 74 is placed in an opened state, the procedure proceeds to step a5 where it is checked whether or not an operation to provide an instruction about recording method has been performed. When it is determined that no recording instruction has been provided, the procedure proceeds to Step a4. When it is determined that the recording instruction has been provided, the procedure proceeds to Step a6 where the recording operation is started according to the recording instruction. Following the completion of the process in Step a6, the procedure comes to an end.

Figure 23:
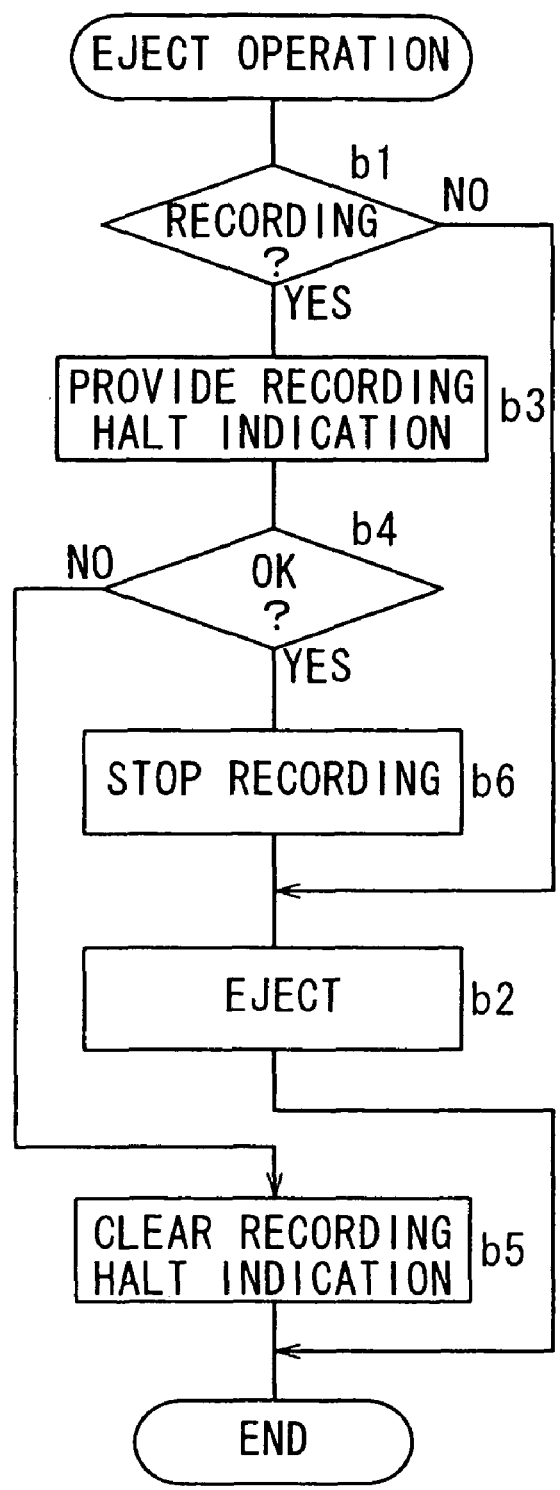
FIG. 23 is a flow chart showing the sequence of steps followed to carry out an operation to stop recording.

FIG. 23 is a flow chart showing the sequence of steps followed to carry out an operation to stop recording. A program for effecting the operation to stop recording is stored in the ROM of the microcomputer 77 for example, so that the operation is carried out under the control of the CPU. Upon an ejection operation being performed in the electronic apparatus 1 during power-up, the operation is started. At the outset, in Step b1, it is checked whether the recording operation is under way or not. When it is determined that no recording operation is being performed, the procedure proceeds to Step b2 where ejection is carried out, and subsequently the procedure comes to an end. Even when it is determined that the recording operation is under way, the procedure proceeds to Step b3 where an indication to stop recording is provided.

Then, the procedure proceeds to Step b4 where it is determined whether to stop the recording operation. When it is determined that the recording operation will not be halted, the procedure proceeds to Step b5 where the indication to stop recording is cleared, and subsequently the procedure comes to an end. When it is determined that the recording operation will be halted, the procedure proceeds to Step b6 where the recording operation is brought to a halt. At this time, when the recording operation is halfway-finished, the already-recorded data will be erased. After that, the procedure proceeds to Step b2.

According to the electronic apparatus 1 thus far described, the detachable panel unit 3 is designed to render the electronic apparatus 1 operative in a state of being attached to the electronic apparatus main body 2, and to render the electronic apparatus 1 inoperative in a state of being detached from the electronic apparatus main body 2. By virtue of this configuration, the advantage is obtained that the electronic apparatus main body 2, namely the electronic apparatus 1 in itself can be prevented from being stolen from a vehicle simply by detaching the detachable panel unit 3 and placing it in a secret area determined by users or others.

By the actions of the first and second lock mechanisms 24 and 25, the detachable panel unit 3 can be maintained in a securely-attached state. On the other hand, the detachable panel unit 3 can be brought into a detached state simply by manually pressing the base end 64a of the first lock mechanism 24. Accordingly, in contract to the conventional construction that requires users to remove a plurality of bolts and detach a plurality of connectors from a vehicle to ensure security, the construction embodying the invention allows simplicity of operation. Upon the first lock mechanism 24 being unlocked, the leaf spring 22 of the detachable panel unit 3 presses the detachable panel unit 3 to cause it to change from an attached state to a detached state. In this state, the detachable panel unit 3 is allowed to move rotationally about the lock pin housing member 41 (i.e. a pivotal point) in a direction away from the electronic apparatus main body 2, and that part of the detachable panel unit 3 which corresponds to the x-y plane (i.e. the upper and lower surfaces) is thereupon exposed from the display panel unit 4. This enables users to catch hold of the detachable panel unit 3 with ease, thereby facilitating the detachment of the detachable panel unit 3. With the first and second lock mechanisms 24 and 25 kept in a locked state, a backlash between the detachable panel unit 3 and the base panel unit 6 can be suppressed successfully under the springy force of the leaf spring 22. This makes it possible to avoid oscillation of the detachable panel unit 3 resulting from vehicle vibrations, and thereby prevent occurrence of interference with the display panel unit 4.

Since the detachable panel unit 3 is located at the other part in the z direction, namely the lower part of the electronic apparatus main body 2 so as to lie under the display panel unit 4, it follows that the detachable panel unit 3 can be operated properly with visibility even if the TFT liquid crystal display 74 is opened upwardly. At this time, it is possible to operate the operation buttons 75 of the display panel unit 4, as a matter of course. Moreover, being constructed in the form of a two-divided casing, the display panel unit 4 and the electronic apparatus main body 2 can be fabricated separately but simultaneously and assembled together, which results in takt time saving. Further, in performing the CD recording operation, when it is judged that the data of a CD has already been recorded, no repetition of recording takes place when the CD is played back again. This makes it possible to secure available space in the HDD.

By dividing a plurality of operation buttons between the detachable panel unit 3 and the display panel unit 4 (the operation buttons 62 and 75) according to function, it is possible to simplify the configurations of the detachable panel unit 3 and the display panel unit 4. Otherwise, the invention may be embodied in other specific forms without departing from the spirit or essential characteristics thereof.

Figure 24A:
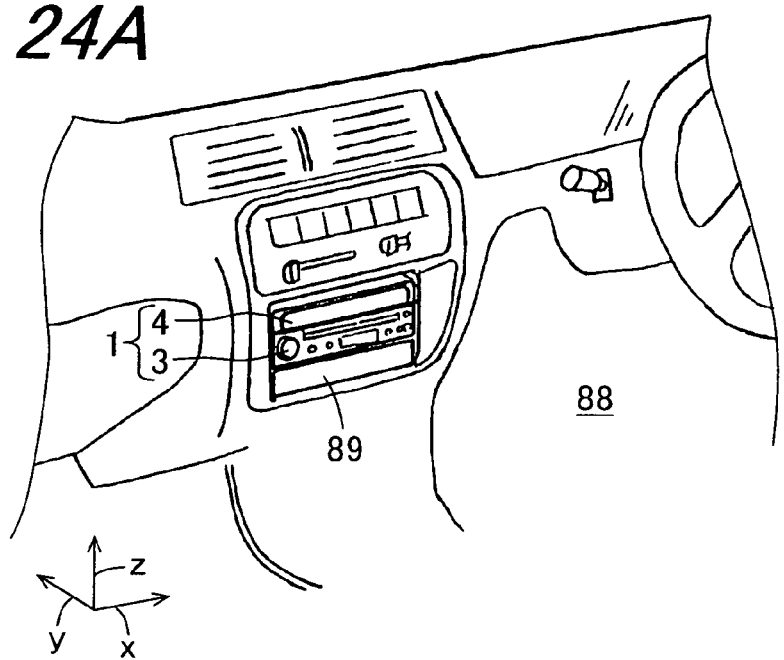
FIGS. 24A and 24B are views of the vehicle-mounted electronic apparatus mounted in a vehicle, with FIG. 24A showing a state where a display panel unit of the vehicle-mounted electronic apparatus is stored in place, and FIG. 24B showing a state where the display panel unit is left opened.
Figure 24B:
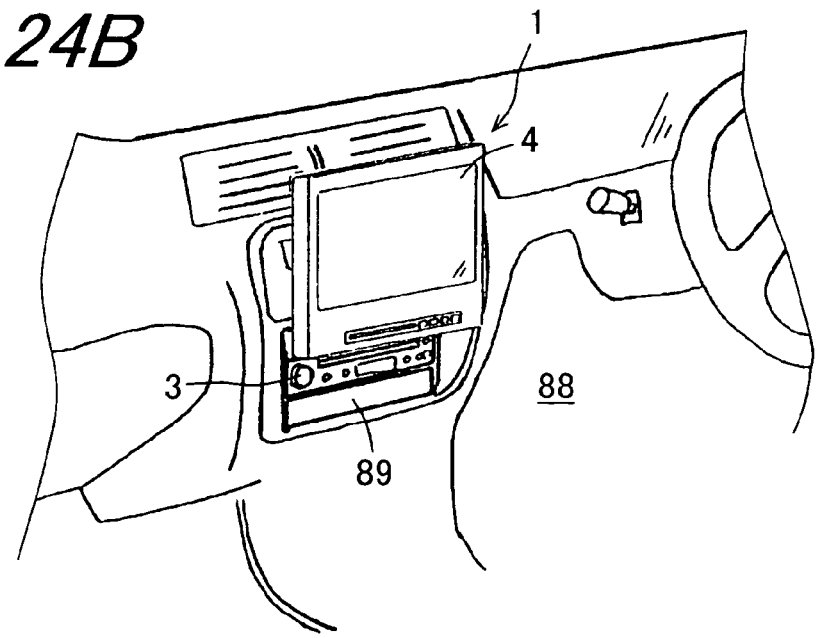

FIGS. 24A and 24B are views of the vehicle-mounted electronic apparatus 1 mounted in a vehicle 88, with FIG. 24A showing a state where the display panel unit 4 is stored in place, and FIG. 24B showing a state where the display panel unit 4 is left opened. In an instrument panel of the vehicle 88 is normally secured a space for a vehicle-mounted audio system or the like apparatus. For example, an electronic apparatus, a glove compartment, or a cup holder can be emplaced in the space at user's choice. In order to enhance the mountability of such instruments, the space is created in conformity with certain dimensional standards. For example, the DIN standards have been widely adopted for defining a length/width dimension of the space.

The space created in the instrument panel of the vehicle 88 is generally set at 2 DIN or 1 DIN in size. In accordance with the size of the space, any given apparatus is mounted therein at user's choice. For example, a 2 DIN space allows the placement of a single electronic apparatus of 2 DIN size, two pieces of electronic apparatuses of 1 DIN size, or a combination of a single electronic apparatus of 1 DIN size and a glove compartment of 1 DIN size.

The example shown in FIGS. 24A and 24B is associated with the case where a 2 DIN space is provided, in the upper part of which is disposed the electronic apparatus 1 of 1 DIN size concerning the embodiment, whereas in the lower part of which is disposed a glove compartment 89 of 1 DIN size. The display panel unit 4 is, when actuated, opened upwardly of the space so that an apparatus (although the glove compartment is mounted in this example, an electronic apparatus such as a radio can also be mounted) disposed in the lower part of the 2 DIN space can be operated without any hindrance.

As described heretofore, by designing the electronic apparatus in conformity with the 1 DIN standard, it is possible to make good use of the space, and thereby enable the addition of another apparatus. Moreover, even if there is only a 1 DIN space, the electronic apparatus can be disposed therein, wherefore the convenience of users can be improved.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A vehicle-mounted electronic apparatus comprising:
   a storage medium;
   a first board in which an avoiding portion formed to avoid interference with the storage medium;
   a second board arranged on the storage medium; and
   a main body unit for housing the storage medium, the first board and the second board, the main body unit having an opening portion through which the storage medium can be attached to and detached from the main body unit.

2. The vehicle-mounted electronic apparatus of claim 1, wherein the first board is provided with at least a navigation section for performing a navigating operation, and
   the second board is provided with at least an audio section for reproducing music data and a recording section for recording on the storage medium the music data reproduced by the audio section.

3. The vehicle-mounted electronic apparatus of claim 1, further comprising:
   a first fan for cooling the first board; and
   a second fan for cooling the second board.

4. The vehicle-mounted electronic apparatus of claim 1, further comprising a display section housed in a casing separately formed from the main body unit, wherein the main body unit and the casing for housing the display section are attached to each other.

5. The vehicle-mounted electronic apparatus of claim 1, further comprising: a display section which can be inserted into or ejected from the main body unit; and an operation button for operating the vehicle-mounted electronic apparatus,
wherein the operation buttons are divided between the main body unit and the display section according to function.

6. The vehicle-mounted electronic apparatus of claim 5, wherein on the display section are arranged operation buttons for operations necessary while the display section is in a state of being ejected from the main body unit.

7. The vehicle-mounted electronic apparatus of claim 1, further comprising:
   a display section which can be inserted into or ejected from the main body unit;
   a reproducing section for reproducing information recorded on a recording medium inserted into the main body unit; and
   a recording section for recording on the storage medium the information reproduced by the reproducing section, wherein the recording section can carry out recording of the information regardless of whether the display section is in an inserted state or in an ejected state.

8. The vehicle-mounted electronic apparatus of claim 1, wherein the main body unit conforms to a 1 DIN standard of a vehicle.

9. A vehicle-mounted electronic apparatus comprising:
   an electronic apparatus main body through which a first recording medium and a second recording medium can be inserted and ejected; and
   an operation section which can be attached to and detached from the electronic apparatus main body,
   wherein the first recording medium can be inserted and ejected through the electronic apparatus main body having the operation section attached thereto, and the second recording medium can be inserted and ejected through the electronic apparatus main body having the operation section detached therefrom.

10. The vehicle-mounted electronic apparatus of claim 9, wherein the operation section has the insertion/ejection port for the first recording medium but not the insertion/ejection port for the second recording medium.

11. The vehicle-mounted electronic apparatus of claim 9, wherein the operation section is provided with a concavity for preventing interference with the second recording medium inserted into the electronic apparatus main body in a state of being attached to the electronic apparatus main body.

12. The vehicle-mounted electronic apparatus of claim 9, wherein the first recording medium is an optical disk, and the second recording medium is a semiconductor memory.

13. The vehicle-mounted electronic apparatus of claim 9, wherein the electronic apparatus main body conforms to a 1 DIN standard of vehicles.

14. A vehicle-mounted electronic apparatus comprising:
   an electronic apparatus main body having separate insertion/ejection ports, one of which allows insertion and ejection of the first recording medium, and another of which allows insertion and ejection of the second recording medium; and
   an operation section which can be attached to and detached from the electronic apparatus main body,
   wherein the insertion/ejection ports are arranged so that the insertion/ejection port for the first recording medium is exposed when the operation section is attached to the electronic apparatus main body, and the insertion/ejection port for the second recording medium is exposed when the operation section is detached from the electronic apparatus main body.

15. The vehicle-mounted electronic apparatus of claim 14, wherein the operation section has the insertion/ejection port for the first recording medium but not the insertion/ejection port for the second recording medium.

16. The vehicle-mounted electronic apparatus of claim 14, wherein the operation section is provided with a concavity for preventing interference with the second recording medium inserted into the electronic apparatus main body in a state of being attached to the electronic apparatus main body.

17. The vehicle-mounted electronic apparatus of claim 14, wherein the first recording medium is an optical disk, and the second recording medium is a semiconductor memory.

18. The vehicle-mounted electronic apparatus of claim 14, wherein the electronic apparatus main body conforms to a 1 DIN standard of vehicles.

19. A vehicle-mounted electronic apparatus comprising:

a casing having an upper part and a lower part, the casing conforming to a 1 DIN standard mountable on a vehicle;

a display section capable of being housed in the upper part of the casing;

a driving section housed in the upper part of the casing, the driving section ejecting the display section to outside of the casing;

an audio board housed in the lower part of the casing;

a navigation board housed in the lower part of the casing;

a storage medium housed in the lower part of the casing, the storage medium being capable of communicating the navigation board and the audio board; and a reproducing section housed in the lower part of the casing, the reproducing section being capable of reproducing a compact disk.

20. The vehicle-mounted electronic apparatus of claim 19, further comprising an operation section having a compact disk insertion/ejection port, which can be attached to and detached from the casing.

21. The vehicle-mounted electronic apparatus of claim 20, wherein the casing is provided with an insertion/ejection port exposed for a semiconductor memory when the operation section is detached from the electronic apparatus main body.

* * * * *